(12) United States Patent
Yamashita et al.

(10) Patent No.: US 7,718,502 B2
(45) Date of Patent: May 18, 2010

(54) SEMICONDUCTOR APPARATUS INCLUDING A THIN-METAL-FILM RESISTOR ELEMENT AND A METHOD OF MANUFACTURING THE SAME

(75) Inventors: Kimihiko Yamashita, Kobe (JP); Yasunori Hashimoto, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 230 days.

(21) Appl. No.: 11/984,167

(22) Filed: Nov. 14, 2007

(65) Prior Publication Data

US 2008/0090371 A1   Apr. 17, 2008

Related U.S. Application Data

(62) Division of application No. 10/861,931, filed on Jun. 7, 2004, now Pat. No. 7,312,515.

(30) Foreign Application Priority Data

| Jun. 11, 2003 | (JP) | ............................. 2003-167097 |
| Feb. 18, 2004 | (JP) | ............................. 2004-040907 |
| May 19, 2004 | (JP) | ............................. 2004-148625 |

(51) Int. Cl.
*H01L 29/72* (2006.01)

(52) U.S. Cl. ........................ 438/382; 438/384; 438/675; 438/696; 438/700

(58) Field of Classification Search ................. 438/382, 438/384, 675, 696, 700
See application file for complete search history.

(56) References Cited

U.S. PATENT DOCUMENTS

| 3,862,017 A | 1/1975 | Tsunemitsu et al. |
| 3,867,193 A | 2/1975 | Sumi |
| 5,811,375 A * | 9/1998 | Nakamura et al. .......... 505/413 |
| 6,422,088 B1 | 7/2002 | Oba et al. |
| 6,667,537 B1 | 12/2003 | Koike et al. |
| 2005/0040494 A1 | 2/2005 | Huttemann et al. |

FOREIGN PATENT DOCUMENTS

| JP | 58-148443 | 9/1983 |
| JP | 63-174336 | 7/1988 |
| JP | 01-239956 | 9/1989 |
| JP | 01-244649 | 9/1989 |
| JP | 02-012859 | 1/1990 |
| JP | 02-027727 | 1/1990 |
| JP | 02-181919 | 7/1990 |
| JP | 03-034352 | 2/1991 |
| JP | 04-044259 | 2/1992 |
| JP | 04-061360 | 2/1992 |
| JP | 04-064235 | 2/1992 |
| JP | 04-065823 | 3/1992 |
| JP | 05-094990 | 4/1993 |
| JP | 07-078747 | 3/1995 |

(Continued)

*Primary Examiner*—Edward Wojciechowicz
(74) *Attorney, Agent, or Firm*—Dickstein Shapiro LLP

(57) ABSTRACT

A semiconductor apparatus includes a wiring pattern, an insulating film, and a thin-metal-film resistor element. The insulating film is formed on the wiring pattern having connection holes vertically penetrating there-through to expose part of the wiring pattern at bottom regions of the connection holes. The connection holes are arranged with a space there-between. The thin-metal-film resistor element is formed on the insulating film and extending to continuously overlay and contact surfaces of the insulating film, inner walls of the connection holes, and the wiring pattern at the bottom regions of the connection holes.

12 Claims, 21 Drawing Sheets

FOREIGN PATENT DOCUMENTS

| | | |
|---|---|---|
| JP | 07-335831 | 12/1995 |
| JP | 09-092648 | 4/1997 |
| JP | 10-056007 | 2/1998 |
| JP | 11-195711 | 7/1999 |
| JP | 2002-124639 | 4/2002 |
| JP | 2002-261237 | 9/2002 |

* cited by examiner

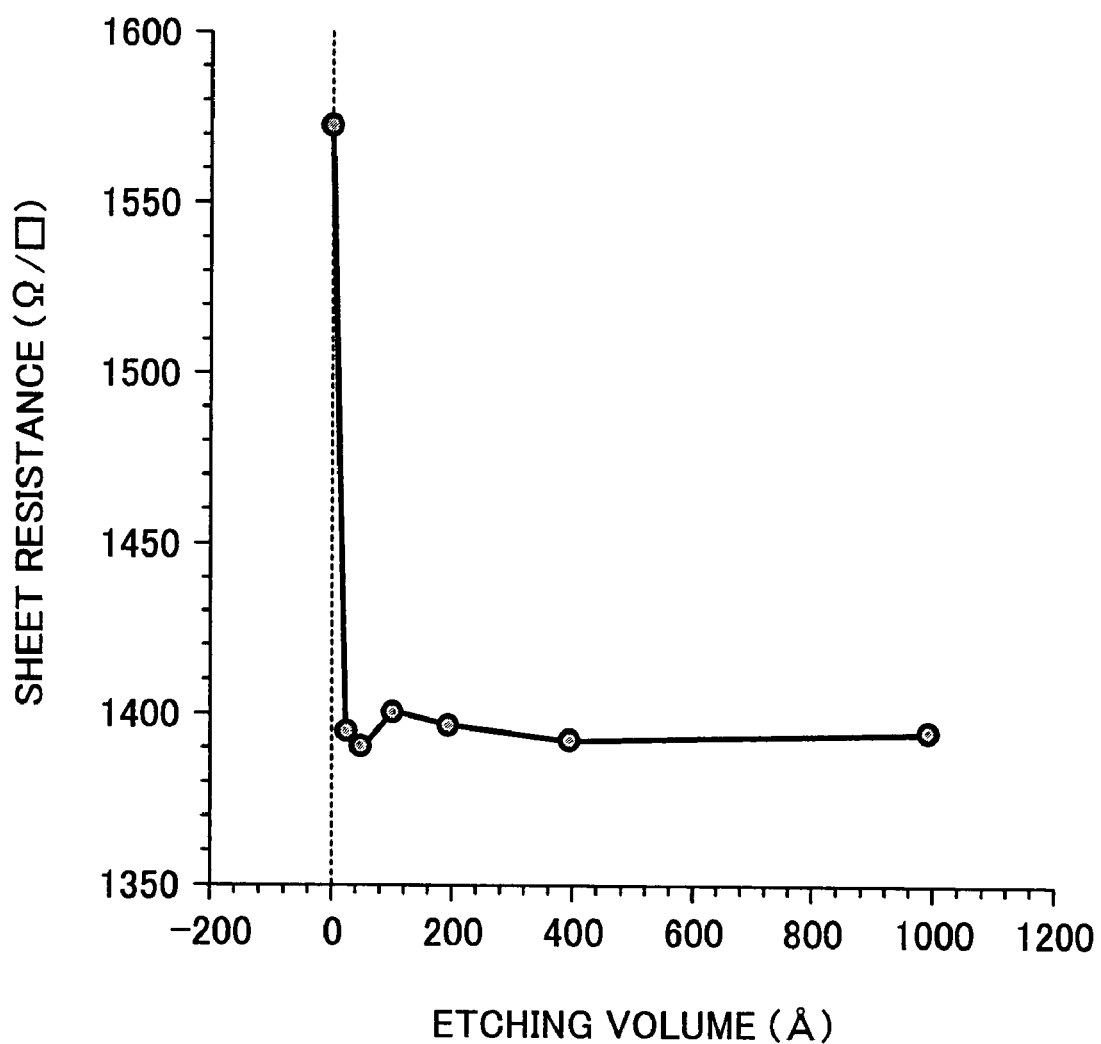

1

SEMICONDUCTOR APPARATUS INCLUDING A THIN-METAL-FILM RESISTOR ELEMENT AND A METHOD OF MANUFACTURING THE SAME

This patent specification is a divisional of U.S. patent application Ser. No. 10/861,931, filed on Jun. 7, 2004 now U.S. Pat. No. 7,312,515, which claims priority from Japanese patent applications, Nos. 2003-167097 filed on Jun. 11, 2003, No. 2004-040907 filed on Feb. 18, 2004, and No. 2004-148625 filed on May 19, 2004 in the Japan Patent Office, the entire contents of which are incorporated by reference herein.

FIELD OF THE INVENTION

The present invention relates to a semiconductor apparatus and method, and more particularly to a semiconductor apparatus that utilizes a thin-metal-film resistor element with eliminating variations of resistance and a method of manufacturing the same.

BACKGROUND OF THE INVENTION

Conventionally, resistor elements are important elements and are widely used in an analog integrated circuit. Amongst various resistor elements, a resistor element made of a thin metal film (hereinafter referred to as a thin-metal-film resistor element) has become a focus of attention in recent years because its temperature coefficient of resistance (TCR), that is, a temperature dependency, is relatively low. The thin-metal-film resistor element is made of any one of materials including CrSi, NiCr, TaN, $CrSi_2$, CrSiN, and CrSiO, for example.

In a semiconductor apparatus having the thin-metal-film resistor element, a higher sheet resistance is aimed so as to meet a demand for a high-integration design. In many cases, the thin-metal-film resistor element is formed with a thickness of 1000 Å or thinner in a semiconductor apparatus.

There are several methods for making an electrical connection to the thin-metal-film resistor element. For example, a first method is to connect a metal wiring directly to the tin-metal-film resistor element. A second method is to form an interlayer insulating film after the thin-metal-film resistor element is formed, to form a connection hole in the interlayer insulating film, and to connect a metal wiring to the thin-metal-film resistor element via the connection hole. A third method is to form a barrier film on a layer of the thin-metal-film resistor element and to connect a metal wiring to the barrier film.

Referring to FIGS. 1A-1F, an exemplary process of the above-mentioned first method is explained. FIGS. 1A-1F illustrate cross-sections of a semiconductor apparatus in respective steps of production which are sequentially conducted. Before the step of FIG. 1A, a silicon substrate 1 in a wafer state is provided. On the silicon substrate 1, formations of an element-separation oxide film 3 and other elements (not shown) including a transistor element (not shown) have been completed. Then, in the step of FIG. 1A, a BPSG (borophosphosilicate glass) film is formed on the silicon substrate 1 and is subjected to a reflow process. The BPSG film is to become a first interlayer insulating film 5 between a gate electrode of the transistor and the metal wiring.

In the step of FIG. 1B, a thin metal film 73 is formed, on the silicon substrate 1, to a thickness in a range of approximately 25 Å to approximately 500 Å. The thin metal film 73 is to form the thin-metal-film resistor element.

In the step of FIG. 1C, a resist pattern 75 is formed on the thin metal film 73. The resist pattern 75 is used to determine a formation region of the thin-metal-film resistor element. Then, by using the resist pattern 75 as a mask, the thin metal film 73 is subjected to a patterning process to form a thin-metal-film resistor element 77.

In the step of FIG. 1D, the resist pattern 75 is removed and then a metal film 79, made of an AlSiCu film, for use in wiring is formed on the surfaces of the thin-metal-film resistor element 77 and the first interlayer insulating film 5. Subsequently, a resist pattern 81 is formed on the metal film 79 so as to pattern the metal film 79 such that part of the metal film 79 remains at two opposite edges of the thin-metal-film resistor element 77.

In the step of FIG. 1E, using a wet etching technique, the metal film 79 is patterned with a mask of the resist pattern 81 so as to form a metal wiring pattern 83. For the etching treatment to the metal film 79 for use in wiring, a dry etching technique is usually used in a general production process of a semiconductor apparatus; but when the thin-metal-film resistor element 77, having a very thin thickness is laid immediately under the metal film 79, the dry etching technique cannot be used because the thin-metal-film resistor element 77 is etched with an over-etching. Therefore, it is necessary to use the wet etching technique to pattern the metal film 79.

In the step of FIG. 1F, by removing the resist pattern 81, the formations of the thin-metal-film resistor element 77 and the metal wiring pattern 83 for making an electrical connection to the thin-metal-film resistor element 77 are completed.

Referring to FIGS. 2A-2F, an exemplary process of the above-mentioned second method is explained. FIG. 2A illustrates a step in which the element-separation oxide film 3, the first interlayer insulating film 5, and the thin-metal-film resistor element 77 are formed on the silicon substrate 1 in a manner similar to the above-described steps of FIGS. 1A-1C.

In the step of FIG. 2B, a CVD (chemical vapor deposition) oxide film 85 with a thickness on the order of 8500 Å for serving as an interlayer insulating film to insulate from the metal wiring is formed on the surfaces of the thin-metal-film resistor element 77 and the first interlayer insulating film 5.

In the step of FIG. 2C, a resist pattern 87 having openings in regions corresponding to two opposite edges of the thin-metal-film resistor element 77 is formed on the CVD oxide film 85 so as to form connection holes to make a connection to the metal wiring. By using the wet etching technique, the CVD oxide film 85 is selectively removed with a mask of the resist pattern 87 and, as a result, connection holes 89 are prepared. The dry etching technique is usually used to form the connection holes 89 in a general production process of a semiconductor apparatus but when the thickness of the thin-metal-film resistor element 77 is thinner than 1000 Å, the wet etching technique is needed to form the connection holes 89, because it becomes difficult to prevent the connection holes 89 from penetrating the thin-metal-film resistor element 77.

In the step of FIG. 2D, a metal film 91 made of an AlSiCu film for use in wiring is formed on the surfaces of the CVD oxide film 85 and inner walls of the connection holes 89.

In the step of FIG. 2E, a resist pattern 93 is formed on the metal film 91 so as to pattern the metal film 91 such that part of the metal film 91 remains at two opposite edges of the thin-metal-film resistor element 77.

In the step of FIG. 2F, using the dry etching technique, the metal film 91 is patterned with a mask of the resist pattern 93 so as to form a metal wiring pattern 95. At this time, because the CVD oxide film 85 is formed underneath the metal film 91, the thin-metal-film resistor element 77 will not be etched by the dry etching process.

Subsequently, the resist pattern 93 is removed so that the formations of the thin-metal-film resistor element 77 and the metal wiring pattern 95 for making an electrical connection to the thin-metal-film resistor element 77 are completed.

Referring to FIGS. 3A-3F, an exemplary process of the above-mentioned third method is explained. FIG. 3A illustrates a step in which the element-separation oxide film 3, the first interlayer insulating film 5, and the thin-metal-film resistor element 77 are formed on the silicon substrate 1 in a manners similar to the above-described steps of FIGS. 1A-1C.

In the step of FIG. 3B, a high-melting-point metal film 97 made of materials such as TiW or the like, to serve as a barrier from the metal wiring, is formed on the surfaces of the thin-metal-film resistor element 77 and the first interlayer insulating film 5. Subsequently, a metal film 99 for use in wiring is formed on the high-melting-point metal film 97. The metal film 99 is made of an AlSi film, an AlSiCu film, or the like.

In the step of FIG. 3C, a resist pattern 101 is formed on the metal film 99 so as to pattern the metal film 99 such that part of the metal film 99 remains at two opposite edges of the thin-metal-film resistor element 77.

In the step of FIG. 3D, using the dry etching technique, the metal film 99 is patterned with a mask of the resist pattern 101 so as to form a metal wiring pattern 103. At this time, since the high-melting-point metal film 97 is formed underneath the metal film 99, the thin-metal-film resistor element 77 will not be etched by the dry etching process.

In the step of FIG. 3E, the resist pattern 101 is removed and then, by using the wet etching technique, the high-melting-point metal film 97 is selectively removed with a mask of the metal wiring pattern 103 so that a high-melting-point metal film pattern 105 is prepared. Thereby, the formations of the thin-metal-film resistor element 77, the metal wiring pattern 103 for making an electrical connection to the thin-metal-film resistor element 77, and the high-melting-point metal film pattern 105 are completed. In this step, the patterning of the high-melting-point metal film 97 with the dry etching process is difficult since the high-melting-point metal film 97 is present immediately above the thin-metal-film resistor element 77.

There is known another conventional semiconductor apparatus in which a resistor element is formed on an uppermost layer wiring electrode through an insulating film and is connected to the uppermost layer wiring electrode, although the resistor element in this case is not in a shape of a thin metal film. In this semiconductor apparatus, the resistor element and the wiring electrode seem to connect to each other with their side surfaces. This side surface connection may be extremely difficult to be materialized in a general semiconductor device manufacturing process. In addition, even if such side surface connection is materialized, when the resistor element is a thin-metal-film resistor element, a contact area between the resistor element and the wiring electrode would be considerably small, which would consequently generate a great amount of contact resistance there between. As a result, this type of semiconductor apparatus may not properly function as electrical circuitry.

In the first method, the patterning of the metal film 79 for use in wiring is difficult with the dry etching technique, in the step of FIG. 1E. This causes a problem of interfering with the high degree of circuitry integration.

Also, the thin-metal-film resistor element 77 is likely to be oxidized in general. Therefore, if the metal film 79 for use in wiring is formed under the condition that the surface of the thin-metal-film resistor element 77 is oxidized, it becomes difficult to make a good electrical connection between the thin-metal-film resistor element 77 and the metal wiring pattern 83. In a general production process of a semiconductor apparatus, a preferable electrical connection is made between the silicon substrate and the metal wiring by removing the naturally-oxidized film from the surface of the silicon substrate with a hydrofluoric acid aqueous solution, for example. The thin-metal-film resistor element 77, however, is easily etched by the hydrofluoric acid aqueous solution. Accordingly, if a removal of an oxide film is performed with the hydrofluoric acid aqueous solution before the metal film 79 is formed in the step of FIG. 1D, the thin-metal-film resistor element 77 may be etched by the hydrofluoric acid aqueous solution.

As a result, it may cause a problem of changing the resistance of the thin-metal-film resistor element 77.

The second method prepares the CVD oxide film 85 on the thin-metal-film resistor element 77 so as to allow the dry etching process to be used in the step of FIG. 2F for the patterning of the metal film 91 for use in wiring. However, the connection holes 89 for making an electrical connection between the thin-metal-film resistor element 77 and the metal wiring pattern 95 are, as described above, needed to be formed with the wet etching process in the step of 2C, which interferes miniaturization of circuitry, that is, a high degree of circuitry integration.

Further, the above-mentioned wet etching process uses the hydrofluoric acid aqueous solution, which etches the thin-metal-film resistor element 77 and therefore, additional measures are required to prevent the etching of the thin-metal-film resistor element 77 with the hydrofluoric acid aqueous solution, in which a barrier film is formed and is patterned on the thin-metal-film resistor element 77. This causes a problem of increasing the steps of the production process.

The third method allows the dry etching to be performed to etch the metal film for use in wiring, as described in the step of FIG. 3D and, in addition, it eliminates the formation of the connection holes. This method, however, needs to pattern the high-melting-point metal film 97 with the wet etching, as described in the step of FIG. 3E. In this method, the high-melting-point metal film 97 is used to form the high-melting-point metal film pattern 105 for determining a substantial length of the thin-metal-film resistor element 77. Accordingly, an area of the high-melting-point metal film 97 etched with the wet etching falls wider than a desired area, resulting in a variation of the substantial length of the thin-metal-film resistor element 77. As a consequence, the resistance of the thin-metal-film resistor element 77 is changed and at the same time, the miniaturization of the circuitry becomes difficult.

Further, in the step of FIG. 3B, the surface of the thin-metal-film resistor element 77, which has been formed before the high-melting-point metal film 97, is likely oxidized. Accordingly, such oxide film formed on the thin-metal-film resistor element 77 is needed to be removed with the hydrofluoric acid aqueous solution, in order to make a good electrical connection between the thin-metal-film resistor element 77 and the high-melting-point metal film 97. However, as described above, if a removal of an oxide film is performed with the hydrofluoric acid aqueous solution before the high-melting-point metal film 97 is formed, the thin-metal-film resistor element 77 may be etched by the hydrofluoric acid aqueous solution. As a result, it may cause a problem of changing the resistance of the thin-metal-film resistor element 77.

As such, the conventional methods inevitably require the wet etching technique due to the thinness of the thin-metal-film resistor element, and therefore, cannot avoid the variations of resistance of the thin-metal-film resistor element, resulting in interfering a high degree of circuitry integration.

Further, these conventional methods require an additional step for forming a barrier film on the thin-metal-film resistor element and an extra treatment to remove the surface oxidized film with the hydrofluoric acid aqueous solution, in order to make a good electrical connection of the thin-metal-film resistor element to the metal wiring.

SUMMARY OF THE INVENTION

The present invention provides a semiconductor apparatus having a thin-metal-film resistor element with a stable resistance.

In one exemplary embodiment, a novel semiconductor apparatus includes a wiring pattern, an insulating film, and a thin-metal-film resistor element. The insulating film is formed on the wiring pattern having connection holes vertically penetrating there-through to expose part of the wiring pattern at bottom regions of the connection holes. The connection holes are arranged with a space there-between. The thin-metal-film resistor element is formed on the insulating film and extends to continuously overlay and contact surfaces of the insulating film, inner walls of the connection holes, and the wiring pattern at the bottom regions of the connection holes.

In one exemplary embodiment, a novel semiconductor apparatus include an insulating film, a thin-metal-film resistor element, a wiring pattern, and connection holes. The thin-metal-film resistor element is formed on the insulating film. The wiring pattern is arranged underneath the insulating film at regions corresponding to two opposite edges of the thin-metal-film resistor element. The connection holes are formed in the insulating film at regions corresponding to the two opposite edges of the thin-metal-film resistor element and to the wiring pattern. In this apparatus, the thin-metal-film resistor element is directly and electrically connected to the wiring pattern in the connection holes.

The thin-metal-film resistor element may have a thickness in a range of approximately 5 Å to approximately 1000 Å.

The thin-metal-film resistor element may be subjected to a planarizing process.

The wiring pattern may include a metal material pattern and a high-melting-point metal film formed at least on an upper surface of the metal material pattern.

The wiring pattern may include a polysilicon pattern and a high-melting-point metal film formed at least on an upper surface of the polysilicon pattern.

The above-mentioned semiconductor apparatus may further include a metal nitride film overlaying an upper surface of the thin-metal-film resistor element. In this apparatus, no metal oxide film is formed between the thin-metal-film resistor element and the metal nitride film.

The wiring pattern may be an uppermost wiring pattern.

In one exemplary embodiment, a novel semiconductor apparatus includes an insulating film, a thin-metal-film resistor element, a wiring pattern, connection holes, an input terminal, and a voltage dividing circuit. The thin-metal-film resistor element is formed on the insulating film. The wiring pattern is arranged underneath the insulating film at regions corresponding to two opposite edges of the thin-metal-film resistor element. The connection holes are formed in the insulating film at regions corresponding to the two opposite edges of the thin-metal-film resistor element and to the wiring pattern. The voltage dividing circuit includes at least two resistor elements and an associated fuse element and is configured to divide a voltage given through the input terminal with the at least two resistor elements to generate an output voltage and to adjust the output voltage by cutting the associated fuse element. In this apparatus, the thin-metal-film resistor element may continuously overlay and contact surfaces of the insulating film, inner walls of the connection holes, and the wiring pattern at bottom regions of the connection holes. In this apparatus, each one of the at least two resistor elements includes the thin-metal-film resistor element.

In one exemplary embodiment, a novel semiconductor apparatus includes an insulating film, a thin-metal-film resistor element, a wiring pattern, connection holes, an input terminal, and a voltage detecting circuit. The thin-metal-film resistor element is formed on the insulating film. The wiring pattern is arranged underneath the insulating film at regions corresponding to two opposite edges of the thin-metal-film resistor element. The connection holes are formed in the insulating film at regions corresponding to the two opposite edges of the thin-metal-film resistor element and to the wiring pattern. The voltage detecting circuit includes a voltage dividing circuit, a reference voltage generator, and a comparator. The voltage dividing circuit includes at least two resistor elements and an associated fuse element and configured to divide a voltage given through the input terminal with the at least two resistor elements to generate an output voltage and to adjust the output voltage by cutting the associated fuse element. The reference voltage generator is configured to generate a reference voltage. The comparator is configured to compare a divided voltage from the voltage dividing circuit to the reference voltage from the reference voltage generator. In this apparatus, the thin-metal-film resistor element continuously overlays and contacts surfaces of the insulating film, inner walls of the connection holes, and part of the wiring pattern at bottom regions of the connection holes. Further, each one of the at least two resistor elements includes the thin-metal-film resistor element.

In one exemplary embodiment, a novel semiconductor apparatus includes an insulating film, a thin-metal-film resistor element, a wiring pattern, connection holes, an input terminal, and a constant voltage generating circuit. The thin-metal-film resistor element is formed on the insulating film. The wiring pattern is arranged underneath the insulating film at regions corresponding to two opposite edges of the thin-metal-film resistor element. The connection holes are formed in the insulating film at regions corresponding to the two opposite edges of the thin-metal-film resistor element and to the wiring pattern. The constant voltage generating circuit includes an output driver, a voltage dividing circuit, a reference voltage generator, and a comparator. The output driver is configured to control an input voltage input through the input terminal. The voltage dividing circuit includes at least two resistor elements and an associated fuse element and is configured to divide a voltage given through the input terminal with the at least two resistor elements to generate an output voltage and to adjust the output voltage by cutting the associated fuse element. The reference voltage generator is configured to generate a reference voltage. The comparator is configured to compare a divided voltage from the voltage dividing circuit to the reference voltage from the reference voltage generator and to control an operation of the output driver in accordance with a result of the comparison. In this apparatus, the thin-metal-film resistor element continuously overlays and contacts surfaces of the insulating film, inner walls of the connection holes, and part of the wiring pattern at bottom regions of the connection holes. Further, each one of the at least two resistor elements includes the thin-metal-film resistor element.

In one exemplary embodiment, a novel method of manufacturing a semiconductor apparatus in which a thin-metal-film resistor element is formed on a first insulating film includes the steps of providing, forming, making, producing, and patterning. The providing step provides a wiring pattern on the first insulating film at regions corresponding to regions in which two opposite edges of the thin-metal-film resistor element are formed. The forming step forms a second insulating film on the wiring pattern and on the first insulating film. The making step makes connection holes in the second insulating film at regions corresponding to regions in which the two opposite edges of the thin-metal-film resistor element and the wiring pattern are formed. The producing step produces a thin metal film on the second insulating film and on inner walls of the connection holes. The patterning step patterns the thin metal film such that a part of the thin metal film remains in the connection holes so as to form a thin-metal-film resistor element.

The producing step may produce the thin metal film with a thickness in a range of approximately 5 Å to approximately 1000 Å.

The insulating films may be subjected to a planarizing process.

The producing step may conduct an etching to the second insulating film with an Ar sputter etching before producing the thin metal film.

The producing step may continuously form the thin metal film without breaking the vacuum after conducting the etching to the second insulating film with the Ar sputter etching.

The etching with the Ar sputter etching may be conducted for an amount of a thickness of 25 Å or more, which is calculated based on an etching effect on a thermally-oxidized film.

The providing step may form the wiring pattern including a metal material pattern and a high-melting-point metal film formed at least on an upper surface of the metal material pattern.

The providing step may form the wiring pattern including a polysilicon pattern and a high-melting-point metal film formed at least on an upper surface of the polysilicon pattern.

The high-melting-point metal film may be formed with a thickness in a range of 500 Å to 3000 Å.

The producing step may form the thin metal film in an oxygen-free atmosphere and subsequently forms a metal nitride film on the thin metal film, and the patterning step may pattern the metal nitride film and the thin metal film so as to form a multi-layered pattern including a metal nitride film pattern and the thin-metal-film resistor element.

In the above-mentioned method, a nitrogen partial pressure in a sputter gas at a time the metal nitride may be formed in a range of 18% to 90%.

The wiring pattern may be an uppermost wiring pattern.

In one exemplary embodiment, a novel method of manufacturing a semiconductor apparatus includes the steps of forming, conducting, and producing. The forming step forms an insulating film. The conducting step conducts an Ar etching to the insulating film. The producing step produces a thin metal film on the insulating film to form a thin-metal-film resistor element.

The Ar sputter etching may be conducted for an amount of a thickness of 25 Å or more, which is calculated based on an etching effect on a thermally-oxidized film.

The producing step may produce the thin metal film with a thickness in a range of approximately 5 Å to approximately 1000 Å.

The insulating film may be subjected to a planarizing process.

BRIEF DESCRIPTION OF THE DRAWINGS

A more complete appreciation of the disclosure and many of the attendant advantages and features thereof can readily be obtained and understood from the following detailed description with reference to the accompanying drawings, wherein:

FIG. 8 is a graph for explaining a relationship between the Ar sputter etching amount and the sheet resistance;

DETAILED DESCRIPTION OF THE EMBODIMENTS

Figure 1A:
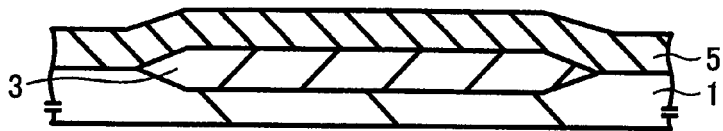
FIGS. 1A-1F are cross-sectional views of a semiconductor apparatus in respective sequential steps of a conventional production process of the semiconductor apparatus.
Figure 1B:
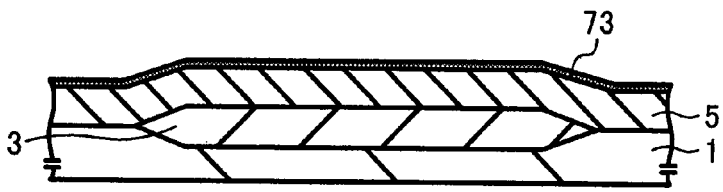
Figure 1C:
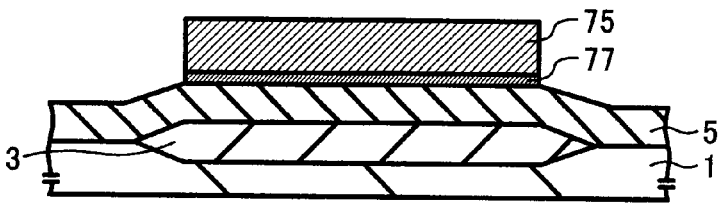
Figure 1D:
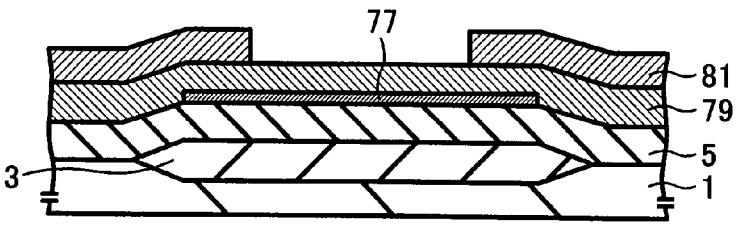
Figure 1E:
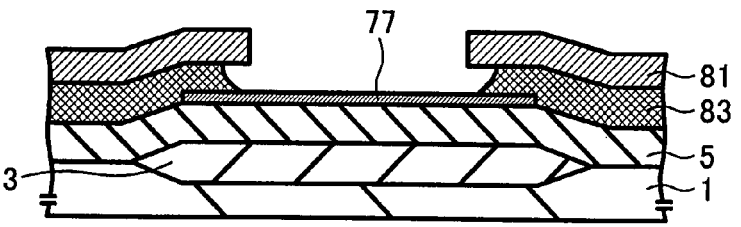
Figure 1F:
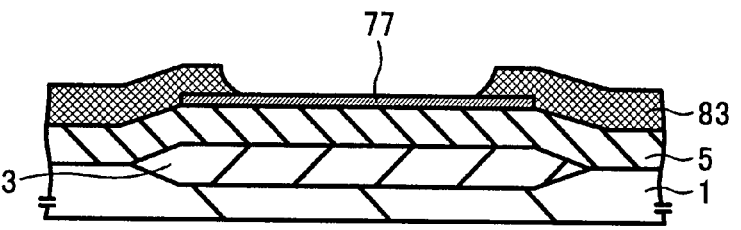
Figure 2A:
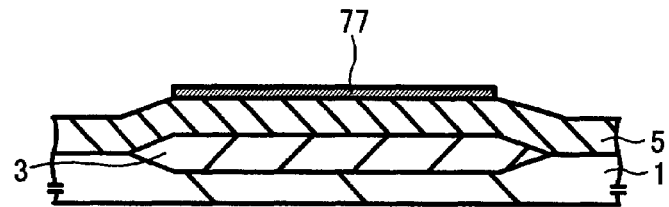
FIGS. 2A-2F are cross-sectional views of a semiconductor apparatus in respective sequential steps of another conventional production process of the semiconductor apparatus.
Figure 2B:
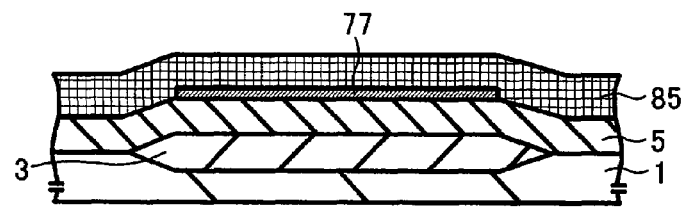
Figure 2C:
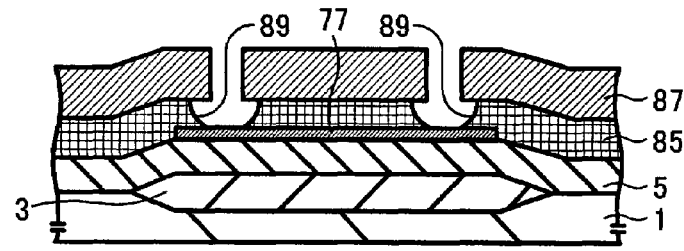
Figure 2D:
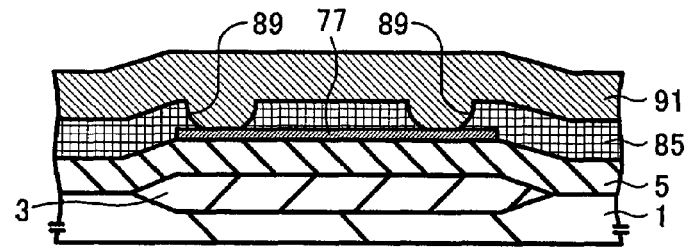
Figure 2E:
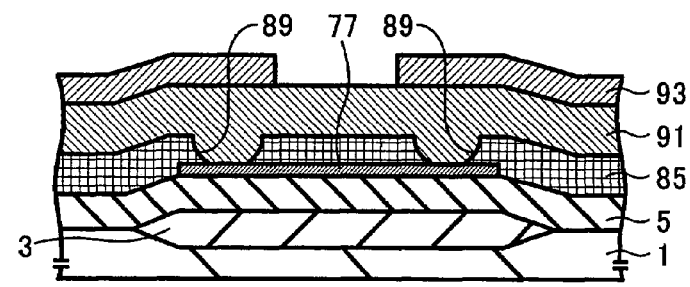
Figure 2F:
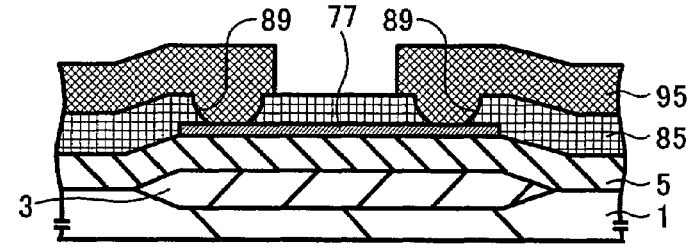
Figure 3A:
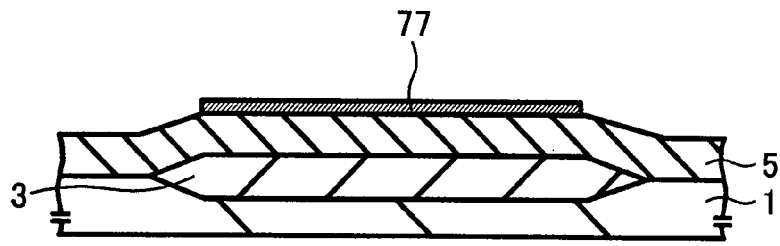
FIGS. 3A-3E are cross-sectional views of a semiconductor apparatus in respective sequential steps of another conventional production process of the semiconductor apparatus.
Figure 3B:
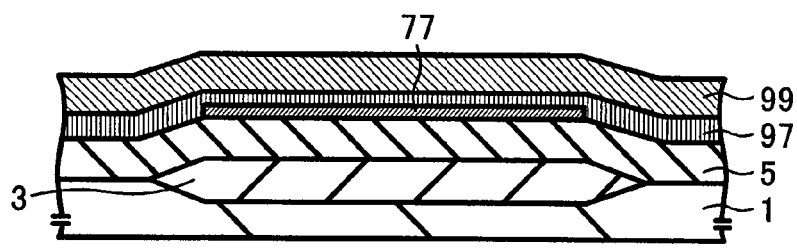
Figure 3C:
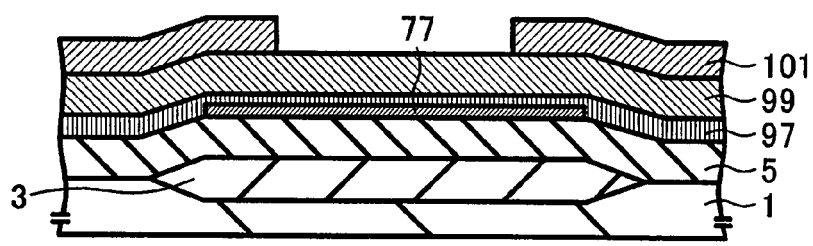
Figure 3D:
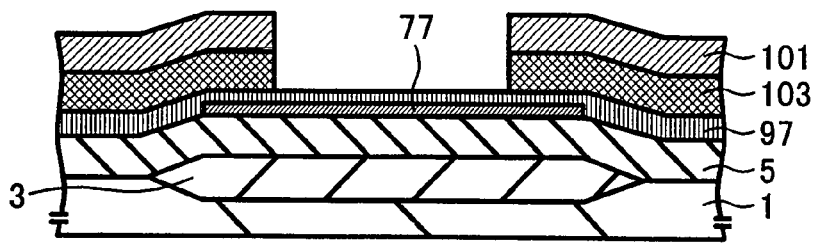
Figure 3E:
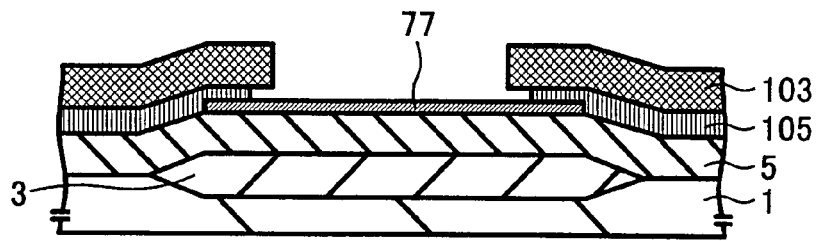

In describing exemplary embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

In the drawings, like reference numerals designate identical or corresponding parts throughout the several views.

Figure 4A:
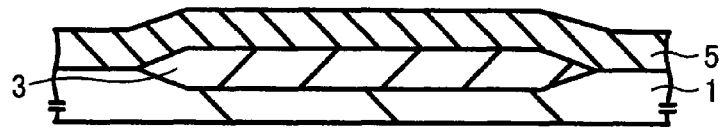
FIGS. 4A-4K are cross-sectional views of a semiconductor apparatus in respective sequential steps of a production process of the semiconductor apparatus according to an exemplary embodiment of the present invention.
Figure 4B:
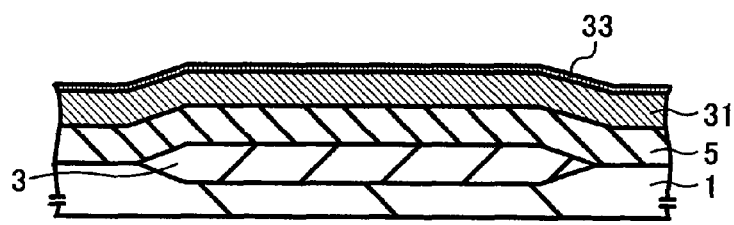
Figure 4C:
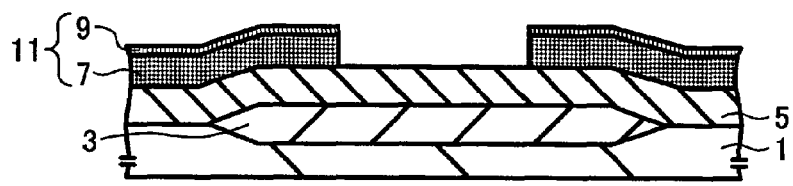
Figure 4D:
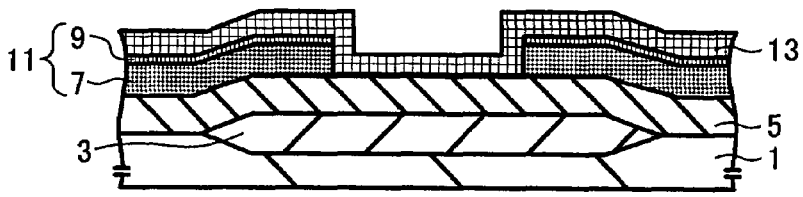
Figure 4E:
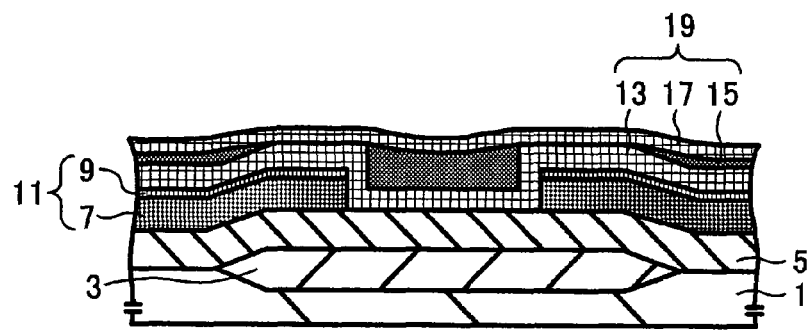
Figure 4F:
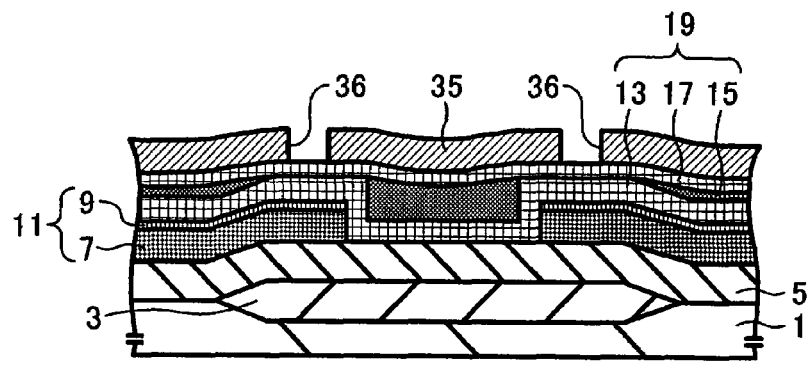
Figure 4G:
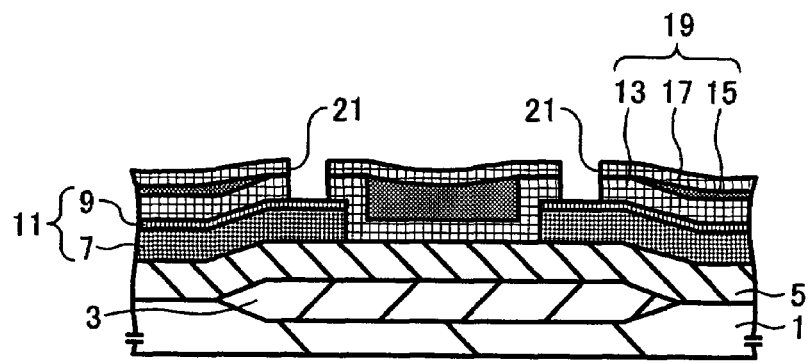
Figure 4H:
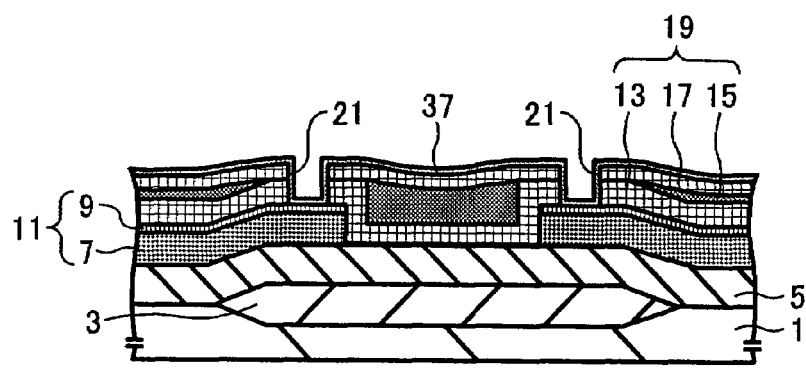
Figure 4I:
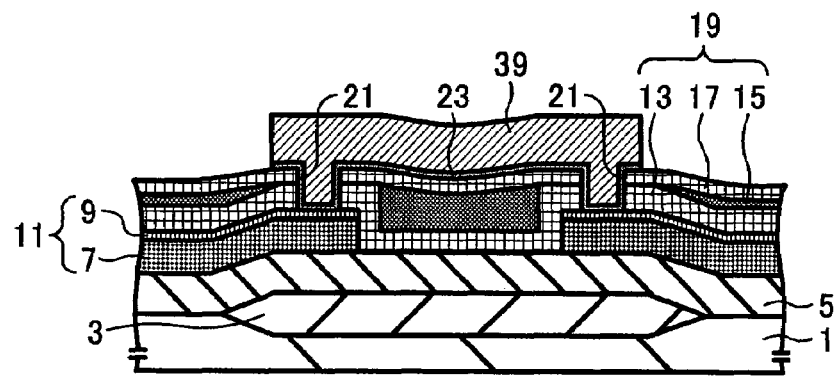
Figure 4J:
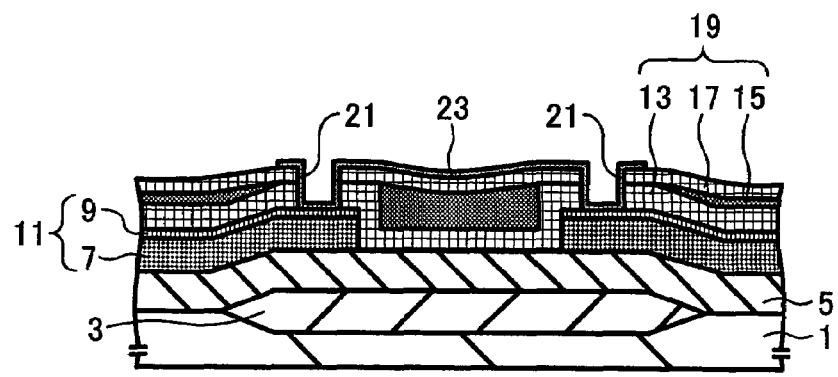
Figure 4K:
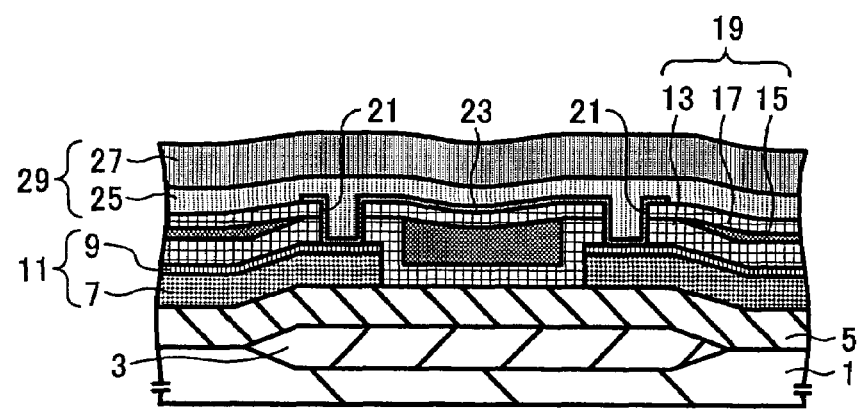

FIGS. 4A-4K illustrate an exemplary process of fabricating a semiconductor apparatus according to an exemplary embodiment of the present invention. FIG. 4K illustrates a final state of an exemplary semiconductor apparatus made through this process. In addition to the elements illustrated in FIGS. 4A-4K, there are various other elements formed on the same substrate but are not shown in these drawings for the sake of simplicity. These other elements include a plurality of transistors, a plurality of capacitors, and so on.

An exemplary semiconductor apparatus according to the embodiment of the present invention is explained below with reference to FIG. 4K. As illustrated in FIG. 4K, a silicon substrate 1 is provided and an oxide film 3 for isolating elements is formed on the silicon substrate 1. A first interlayer isolating film 5 including one of a BPSG (borophosphosilicate glass) film or a PSG (phosphosilicate glass) film is formed on the surfaces of the silicon substrate 1 and the oxide film 3. The first interlayer insulating film 5 may be referred to as a primary isolating layer. A wiring pattern 11, including a metal material pattern 7 and a high-melting-point metal film 9 formed on the surface of the metal material pattern 7, is formed on the first interlayer insulating film 5. The metal material pattern 7 includes an AlSiCu film, for example, and the high-melting-point metal film 9 includes a TiN film to serve as a reflection protecting film and also a barrier film.

A second interlayer insulating film 19 is formed on the surfaces of the first interlayer insulating film 5 and the wiring pattern 11. The second interlayer insulating film 19 includes a plasma CVD (chemical vapor deposition) oxide film 13, an SOG (spin on glass) film 15, and a plasma CVD (chemical vapor deposition) oxide film 17, which are sequentially formed in this order upward from beneath. The second interlayer insulating film 19 is provided with connection holes 21 at a region corresponding to two opposite edges of a thin-metal-film resistor element 23 (e.g., a CrSi film) and the wiring pattern 11.

The thin-metal-film resistor element 23 is formed on a surface of the second interlayer insulating film 19, specifically on inside walls and bottom surfaces (i.e., the surfaces of the wiring pattern 11) of the connection holes 21 and on the region between the connection holes 21. The thin-metal-film resistor element 23 includes edges opposite to each other which are electrically connected to the wiring pattern 11 in the connection holes 21.

A passivation film 29, including a silicon oxide film 25 as a lower film and a silicon nitride film 27 as an upper film, is formed as a final protection film on the thin-metal-film resistor element 23.

Referring now to FIGS. 4A-4K, an exemplary process of fabricating the above-described semiconductor apparatus illustrated in FIG. 4K is explained. FIG. 4A illustrates the step in which the first interlayer insulating film 5 including one of the BPSG film or the PSG film is formed to have a thickness of approximately 8000 Å on the silicon substrate 1 using a normal pressure CVD (chemical vapor deposition) apparatus. At this time, the silicon substrate 1 is in a wafer state after undergoing the formation of the oxide film 3, transistors (not shown), and so forth on the surface thereof. After the CVD process, a thermal processing such as a reflow process, for example, is performed to smooth the surface of the first interlayer insulating film 5.

In the step of FIG. 4B, a wiring metal film 31 including an AlSiCu film is formed to a thickness of approximately 5000 Å on the first interlayer insulating film 5 using a DC (direct current) magnetron sputtering apparatus, for example. Further, a high-melting-metal film 33 as the reflection protecting film, which is publicly known, is formed to a thickness of approximately 800 Å on the wiring metal film 31, continuously with the formation of the wiring metal film 31 under vacuum. In this embodiment, a TiN film is used as the high-melting-metal film 33. The high-melting-metal film 33 serves also as a barrier film to stabilize a contact resistance between a metal material pattern formed from the wiring metal film 31 in a downstream step and a thin-metal-film resistor element formed also in a downstream step. Therefore, it is preferable to form the wiring metal film 31 and the high-melting-metal film 33 under vacuum.

In the step of FIG. 4C, the high-melting-metal film 33 and the wiring metal film 31 are patterned to form the wiring pattern 11 including the metal material pattern 7 and the high-melting-metal film 9, by using a photo engraving technique and an etching technique both which are known techniques. Since the high-melting-metal film 33 serving as the reflection protecting film is formed on the wiring metal film 31, a resist pattern which determines a region for forming the wiring pattern 11 can accurately be formed without having a larger or smaller shape.

At this stage, unlike the background technique that forms a thin-metal-film resistor element, the wiring pattern 11 is formed on a primary film which is the first interlayer insulating film 5, and therefore the patterning-process with respect to the high-melting-metal film 33 and the wiring metal film 31 can be conducted with a sufficient over-etching by using a dry etching technique. Accordingly, the necessity of the patterning with a wet etching is evaded, which is the problem of the background technique for the miniaturization of circuitry.

In the step of FIG. 4D, the plasma CVD oxide film 13 is formed to a thickness of approximately 6000 Å on the surfaces of the first interlayer insulating film 5 and the wiring pattern 11 by using the plasma CVD technique, for example.

In the step of FIG. 4E, a coating treatment and an etch back treatment, which are publicly known techniques, are conducted with respect to the SOG to form the SOG film 15 on the plasma CVD oxide film 13 and is smoothed. After that, the plasma CVD oxide film 17 for preventing a dispersion of ingredients of the SOG film 15 is formed to an extent of approximately 2000 Å and, as a result, the second interlayer insulating film 19, including the plasma CVD oxide film 13, the SOG film 15, and the plasma CVD oxide film 17, is formed.

In the step of FIG. 4F, a resist pattern 35 is formed to make connection holes in the second interlayer insulating film 19 in regions corresponding to regions in which two edges of the thin-metal-film resistor element opposite to each other are scheduled to be formed and corresponding to the region of the wiring pattern 11. The resist pattern 35 includes holes 36 in regions corresponding to regions in which two edges of the thin-metal-film resistor element opposite to each other are scheduled to be formed and corresponding to the region of the wiring pattern 11.

In the step of FIG. 4G, the second interlayer insulating film 19 is selectively removed with a mask of the resist pattern 35 under exemplary conditions that an RF power is 700 watts, a flow rate of Ar is 500 sccm (standard cubic centimeter per minute), a flow rate of $CHF_3$ is 500 sccm, a flow rate of $CF_4$ is 500 sccm, and a pressure is 3.5 Torr, by using a parallel flat-plate plasma etching apparatus. By this removal, the connection holes 21 of the second interlayer insulating film 19 are formed. In the bottom of the connection holes 21, the high-melting-metal film 9 serving as the reflection protecting film and the barrier film remains with a thickness of approximately 600 Å. After that, the resist pattern 35 is removed.

A process for removing a by-product produced and deposited on the walls of the connection holes 21 and so forth during the etching can be conducted after the formation of the connection holes 21. With a purpose of improving a step coverage of the thin-metal-film resistor element inside the connection holes 21, the shape of the connection holes 21 can be executed by using a taper etching which uses an altering etching condition, a different etching process combining the wet etching and dry etching techniques.

It is greatly possible to suppress an etching rate of the high-melting-metal film 9 relative to an etching rate of the second interlayer insulating film 19 to a further lower level in the above seventh step by optimizing conditions of the plasma etching. As a consequence, the thickness of the high-melting-metal film 9 remaining in the bottom of the connection holes 21 can be made greater than that of the above-described embodiment. It is also possible to secure a sufficient thickness of the high-melting-metal film 9 remaining in the bottom of the connection holes 21 while suppressing the thickness of the high-melting-metal film 9 when it is formed. Thus, the formation of the connection holes 21 is conducted before the formation of the thin-metal-film resistor element and therefore the connection holes 21 can be processed without being subjected to any restrictions due to a thinness of the thin-metal-film resistor element. This makes it possible to pursue the miniaturization of circuitry by using the dry etching technique.

In the step of FIG. 4H, an Ar sputtering etching is performed relative to surfaces of the second interlayer insulating film 19 including the inside walls of the connection holes 21 under exemplary conditions that a DC (direct current) bias is 1250 volts, a flow rate of Ar is 20 sccm, a pressure is 8.5 mTorr, and a process time is 20 seconds, under vacuum in an Ar sputtering etching chamber of a multi-chamber sputtering apparatus. The condition used here is equivalent to a condition for performing the etching of a thermally-oxidized film formed in a wet atmosphere at a temperature of approximately 1000° C. by approximately 50 Å. After the performance of this process, the thickness of the high-melting-metal film 9 remaining in the bottom of the connection holes 21 is in the order of 500 Å.

Subsequently, a thin-CrSi film 37 for the thin-metal-film resistor element is formed without a break of the vacuum after a completion of the Ar sputtering etching. In this embodiment, the semiconductor wafer is transported from the Ar sputtering etching chamber to a sputtering chamber having therein a target CrSi and then the process is performed under exemplary conditions that a DC (direct current) power is 0.7 kilowatts, a flow rate of Ar is 85 sccm, a pressure is 8.5 mTorr, and a process time is 9 seconds. The target CrSi includes 80 wt % (weight percent) of Si and 20 wt % of Cr. As a result, the thin-CrSi film 37 to an extent of approximately 50 Å is formed on the surfaces of the second interlayer insulating film 19 and the inside walls of the connection holes 21.

In this way, it is possible to remove an extremely small amount of natural oxides formed on the surface of the high-melting-metal film 9 at the bottom of the connection holes 21, while cleaning off the inside of the connection holes 21 by performing the Ar sputtering etching processing relative to the second interlayer insulating film 19 and the inside walls of the connection holes 21 before the formation of the thin-CrSi film 37 for the thin-metal-film resistor element. Thereby, a preferable electrical connection can be achieved between the wiring pattern 11 and the thin-CrSi film 37.

Further, it is possible to improve a dependence of the thin-CrSi-film resistor element made from the thin-CrSi film 37 in a later process on a film prepared underneath by the above-described Ar sputtering etching processing.

In the step of FIG. 4I, a resist pattern 39 is formed for determining the formation region of the thin-metal-film resistor element on the thin-CrSi film 37 by using the photo engraving technique. The thin-CrSi film 37 is patterned with a mask of the resist pattern 39 to form the thin-CrSi-film resistor element 23 by using an RIE (reactive ion etching) apparatus.

In the step of FIG. 4J, the resist pattern formed in the step of FIG. 4I is removed. Since the thin-CrSi-film resistor element 23 is electrically connected to the wiring pattern 11 in the connection holes 21, the present embodiment does not need to use the hydrofluoric acid aqueous solution to remove a metal-oxidized film, which may be deposited on the surface of the thin-CrSi-film resistor element 23.

In the step of FIG. 4K, the silicon oxide film 25 as the passivation film and the silicon nitride film 27 are sequentially formed in this order upward from beneath on the surfaces of the thin-CrSi-film resistor element 23 and the second interlayer insulating film 19. Thus, the manufacturing process of the semiconductor apparatus ends.

According to the above embodiment, the wiring pattern 11 and the connection holes 21 are formed and then the thin-CrSi-film resistor element 23 is formed so that an electrical connection between the thin-CrSi-film resistor element 23 and the wiring pattern 11 is made in the connection holes 21. Therefore, there is no need to conduct the patterning process with the wet etching after the patterning process of the thin-CrSi-film resistor element 23.

Also, since a surface of the thin-CrSi-film resistor element 23 in contact with the wiring pattern 11 is not exposed to the atmosphere, the electrical connection between the thin-CrSi-film resistor element 23 and the wiring pattern 11 can be made stably and sufficiently without performing the processes for eliminating surface oxidized film and forming an etching protection barrier film.

Thereby, the thin-CrSi-film resistor element 23 can be miniaturized to a sufficient extent while stabilizing its resistance value without increasing the number of processes, regardless of the thickness of the thin-CrSi-film resistor element 23.

Furthermore, because the high-melting-point metal film 9, functioning as a barrier film, is formed between the thin-CrSi-film resistor element 23 and the metal material pattern 7, variations of the contact resistance between the thin-CrSi-film resistor element 23 and the wiring pattern 11 can be reduced, thereby increasing the yield and the accuracy of the resistance value.

Further, the high-melting-point metal film 9 functions as a barrier film and as a reflection protecting film at the same time. That is, the high-melting-point metal film 9 can be formed without increasing the manufacturing process in comparison with the background technique. Thereby, the contact resistance between the thin-metal-film resistor element and the wiring pattern can be stabilized while an increase of the manufacturing cost is suppressed.

Figure 5:
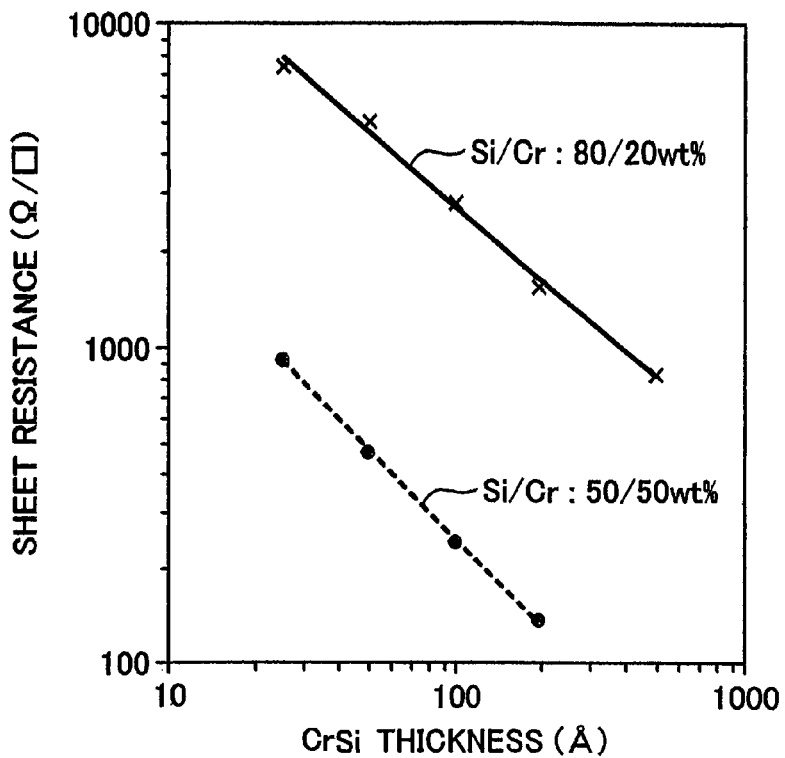
FIG. 5 is a graph for explaining a relationship between a sheet resistance and a thickness of a thin-metal-film resistor element formed according to the present invention.
Figure 6:
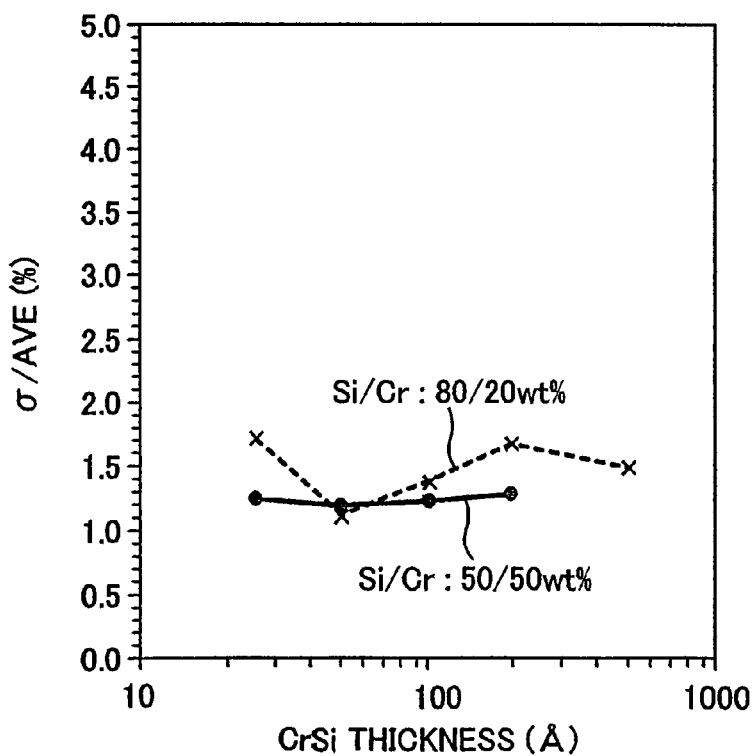
FIG. 6 is a graph for explaining a relationship between a value ($\sigma$/AVE) and a thickness of a thin-metal-film resistor element formed according to the present invention.

A thin-metal-film resistor element structured in a manner similar to that described above has been subjected to examinations to observe characteristics thereof. Such characteristics are explained with reference to FIGS. 5 and 6. FIG. 5 demonstrates a relationship between a sheet resistance and a thickness of the thin-metal-film resistor element examined, in which the vertical axis is a sheet resistance in units of Ω/square unit and the horizontal axis is a thickness of the CrSi film in units of Å (angstrom). In the examination, a sheet resistance is measured at 63 positions in the surface of a wafer of the thin-metal-film resistor element. A standard deviation (σ) of the measurement results of the 63 positions is divided by an average AVE (i.e., σ/AVE). FIG. 6 shows a relationship between a value of σ/AVE and the thickness of the CrSi film, in which the vertical axis is σ/AVE in units of % (percent) and the horizontal axis is the thickness of the CrSi film in units of Å.

Test samples of the thin-metal-film resistor element for the above-mentioned examinations were formed with the multi-chamber sputtering apparatus under exemplary conditions that the DC power was 0.7 kW, the flow rate of Ar was 85 sccm, and the pressure was 8.5 mTorr. A first formation target Si/Cr had a composition of 50/50 wt % and a second formation target Si/Cr had a composition of 80/20 wt %. By adjusting a deposition time, test samples of the thin CrSi film with a thickness in a range of 25 Å to 500 Å were made based on the first and second formation targets. It should be noted that no samples of the thin CrSi film with a thickness of approximately 500 Å were made based on the first formation target having a composition of 50/50 wt %.

The Ar sputtering etching process before the formation of the thin CrSi film was conducted with the above-mentioned multi-chamber sputtering apparatus under exemplary conditions where the DC bias was 1250 volts, the flow rate of Ar was 20 sccm, the pressure was 8.5 mTorr, and the process time was 160 seconds. The condition used here is equivalent to a condition for removing by etching a thermally-oxidized film formed in a wet atmosphere at a temperature of approximately 1000° C. by approximately 400 Å.

The above-described samples were applied with an exemplary structure in which an AlSiCu film having a thickness of approximately 500 Å was used as an underlying metal wiring layer connected to the thin-metal-film resistor element, and a TiN film on the AlSiCu film was not formed at the bottom of the connection holes between the AlSiCu film and the thin CrSi film.

The sheet resistance of the thin-metal-film resistor element is measured with a two-terminal measurement in which twenty 0.5 μm-by-50 μm strip patterns were aligned with a 0.5 μm spacing and one of the twenty patterns is applied with a voltage of 1 volt across that strip pattern, thereby measuring a current value flowing through the pattern.

The dimensions of the connection hole connecting the metal wiring to the thin-CrSi-film resistor element was 0.6 μm by 0.6 μm.

As illustrated in FIG. 5, either one of the first formation target CrSi of 50/50 wt % and the second formation target CrSi of 80/20 wt % had a linear characteristic in the relationship between the film thickness and the sheet resistance in such a wide range of 25 Å to 200 Å. Thus, the embodiment according to the present invention can form an extremely miniaturized thin-metal-film resistor element in a thin film which cannot be fabricated by the background technique.

FIG. 6 demonstrates the variations of the sheet resistance at the 63 positions in the surface of a wafer, in each case of the first and second formation target CrSi of 50/50 wt % and 80/20 wt %, respectively. As shown in FIG. 6, in either one of the first and second formation target CrSi of 50/50 wt % and 80/20 wt %, respectively, the variations of the resistance value are substantially insensitive to the film thickness and the variations were stabilized in a considerably small range. Accordingly, by adopting the structure of the present invention, it becomes possible to stably form an extremely miniaturized thin-metal-film resistor pattern, regardless of the film thickness.

Figure 7A:
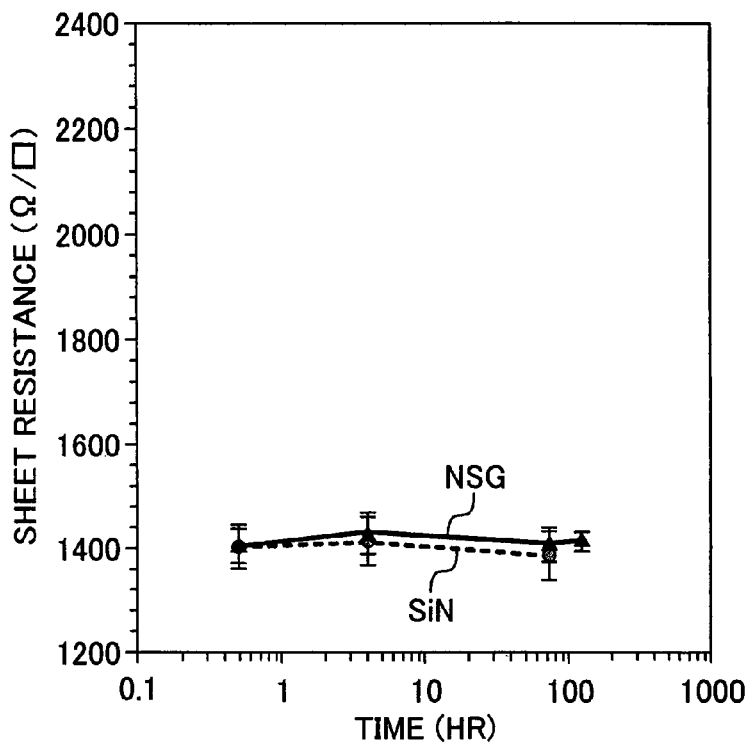
FIGS. 7A and 7B are graphs for explaining a relationship between the sheet resistance of a thin-CrSi-film resistor element and a lapse time after formation of a film laying underneath the thin-CrSi-film resistor element in cases when an Ar sputter etching process is conducted and when not conducted before formation of a thin metal film for use to form the thin-CrSi-film resistor element.

FIG. 7A demonstrates a relationship between the sheet resistance of the thin-CrSi-film resistor element and the time lapsed from the time the underlying film of the thin-metal-film resistor element was formed. In this relationship, the Ar sputtering etching process was performed before the thin metal film was prepared to form the thin-metal-film resistor element. However, a relationship demonstrated in FIG. 7B, between the sheet resistance of the thin-CrSi-film resistor element and the time lapsed from the time the underlying film of the thin-metal-film resistor element was formed, the Ar sputtering etching process was performed before the thin metal film was prepared to form the thin-metal-film resistor element. In both FIGS. 7A and 7B, the vertical axis represents sheet resistance in units of Ω/□ (ohms per square unit) and the horizontal axis represents a lapse time in hours after the formation of the underlying film.

Figure 7B:
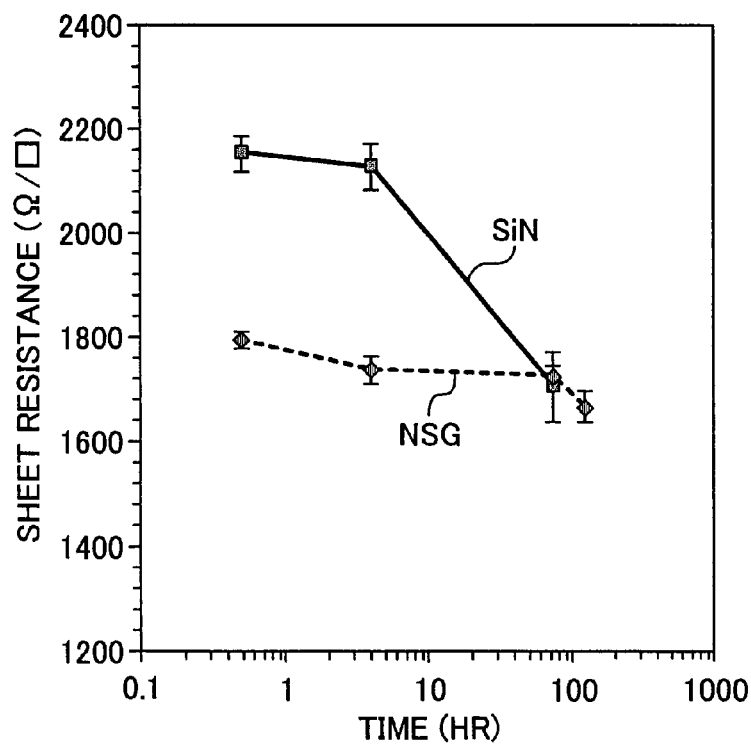

As samples from FIGS. 7A and 7B, two silicon wafers were prepared as underlying films by using the plasma CVD method, a plasma SiN film with a thickness of 2000 Å, and a plasma NSG (non-doped silicate glass) film. The sheet resistance of the thin-CrSi-film resistor element is measured with a four-terminal measurement using the thin-CrSi-film resistor element formed on the above silicon wafers.

The plasma SiN film was formed with the parallel flat-plate plasma CVD apparatus under exemplary conditions: a temperature of 360° C., a pressure of 5.5 Torr, an RF power of 200 watts, a flow rate of 70 sccm for $SiH_4$, a flow rate of 3500 sccm for $N_2$, and a flow rate of 40 sccm for $NH_3$. The plasma NSG film was formed with the flat-plate plasma CVD apparatus under exemplary conditions; a temperature of 360° C., a pressure of 3.0 Torr, an RF power of 250 watts, a flow rate of 16 sccm for $SiH_4$, and a flow rate of 1000 sccm for $N_2O$.

The thin-CrSi-film resistor element was formed to a thickness of 100 Å with the multi-chamber sputtering apparatus under exemplary conditions: a target Si/Cr of 80/20 wt %, a DC power of 0.7 kW, a flow rate of 85 sccm for Ar, a pressure of 8.5 mTorr, and a processing time of 13 seconds.

The sample subjected to the Ar sputter etching was formed with the multi-chamber sputtering apparatus under exemplary conditions: a DC bias of 1250 volts, a flow rate of 20 sccm for Ar, a pressure of 8.5 mTorr, and a processing time of 80 seconds. This corresponds to a process for removing through etching a thermally-oxidized film, formed under a temperature of 1000° C. and a wet atmosphere, by a thickness of 200 Å.

As demonstrated in FIG. 7B, when the Ar sputter etching was not conducted before the formation of the thin-CrSi-film, the sheet resistance on the SiN film and the sheet resistance on the NSG film have a considerable difference from each other due to the difference of the underlying films (i.e., the SiN film and the NSG film). It is also demonstrated in FIG. 7B that the sheet resistance greatly changes according to the lapse time until the thin-CrSi-film resistor element is formed after the formation of the underlying film.

In contrast to this, as shown in FIG. 7A, when the Ar sputter etching was conducted, the sheet resistance on the SiN film and the sheet resistance on the NSG film appears to have only a small difference from each other, that is, the thin-CrSi-film resistor element has no substantial changes in the sheet resistance, regardless of the materials of the underlying film (i.e., whether the SiN film or the NSG film) and the lapse time from the formation of the underlying film to the time of the formation of the thin-CrSi-film resistor element.

From this, it should be understood that the variations of the sheet resistance generated due to the above-mentioned reasons such as the length of the lapse time and the material difference can greatly be improved by continuously forming in a vacuum a thin metal film for serving as a thin-metal-film resistor element after the process of the Ar sputter etching.

FIG. 8 shows a relationship between an amount of the Ar sputter etching and the sheet resistance. The vertical axis is a sheet resistance in units of $\Omega/\square$ and the horizontal axis is an amount of etching in units of Å which is a corresponding value calculated based on a thermally-oxidized film. In the samples of FIG. 8, the plasma NSG film and the thin-CrSi-film resistor element, made under the same conditions as those in the samples of FIGS. 7A and 7B, were used as the underlying film and the thin-CrSi-film resistor element. When a week lapsed after the completion of the film formation, the Ar sputter etching was conducted to the plasma NSG film under the same conditions as those used for the samples of FIGS. 7A and 7B, except for an etching amount. Subsequently, the thin-CrSi-film resistor element was formed on the plasma NSG film. In the Ar sputter etching, the etching amount is adjusted to be 0 Å, 25 Å, 50 Å, 100 Å, 200 Å, 400 Å, and 1000 Å based on the conversion of etching amount relative to a thermally-oxidized film formed under a wet atmosphere. At each time of the adjustments, the sheet resistance is measured by a four-terminal measurement method. In the adjustments, an etching amount of 0 Å means that no Ar sputter etching was conducted.

Based on the results shown in FIG. 8, it was understood that, among the above-mentioned etching amount adjustments, the 25 Å etching amount sufficiently brought the effect, in that the resistance value of the thin-CrSi-film resistor element was stabilized, was obtained. As described above, the samples shown in FIG. 8 were with the etching amount up to 1000 Å. However, even if a sample with the etching amount greater than 1000 Å was made, the above-described effect by the Ar etching can be brought when the underlying film remains underneath the formation region of the thin-metal-film resistor element.

Further, as described below, the Ar sputter etching process advantageously affects not only the sheet resistance of the underlying film but also the resistance stability of the thin CrSi film itself.

Figure 9:
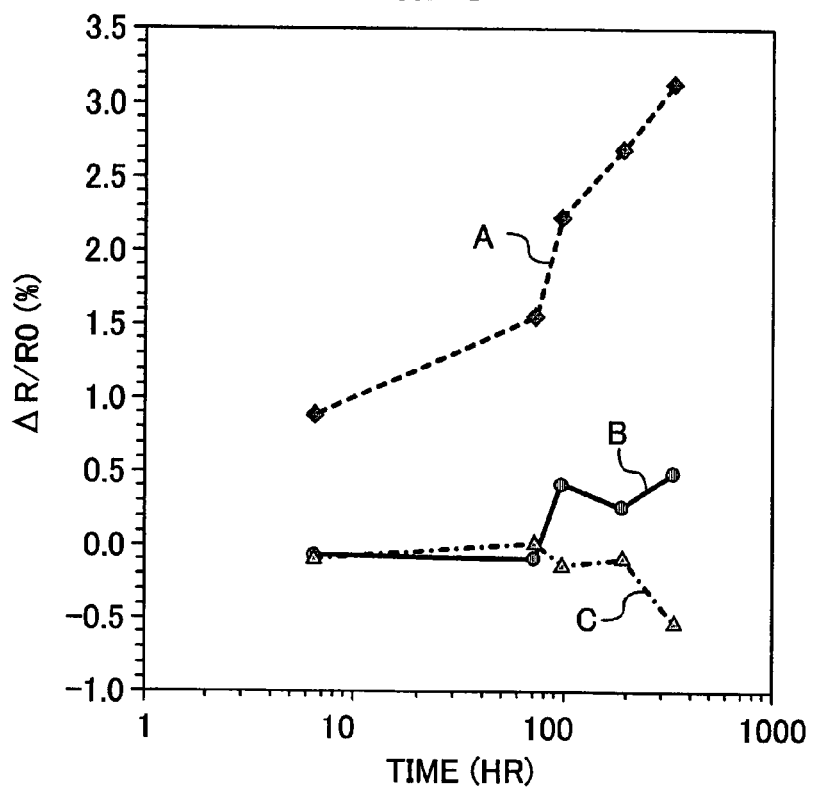
FIG. 9 is a graph for explaining a relationship between a time length in which the thin CrSi film is exposed to an atmosphere after it is prepared and a rate of sheet resistance change ($\Delta R/R0$)

FIG. 9 demonstrates a relationship between a time length in which the thin CrSi film is left exposed to the atmosphere with a temperature of 25° C. and a humidity of 45%, after the formation of the thin CrSi film and a resistance change rate ($\Delta R/R0$) from a resistance (R0) at the time the formation of the thin CrSi film is formed. In FIG. 9, the vertical axis represents the resistance change rate ($\Delta R/R0$) in percentage and the horizontal axis represents the time length.

In FIG. 9, the plasma NSG film and the thin-CrSi-film resistor element, which were formed in a manner similar to those used for making the samples of FIGS. 7A and 7B, were applied to the samples of FIG. 9. In this performance of FIG. 9, a sample A was not treated by the Ar sputter etching, a sample B was processed with the Ar sputter etching for 40 seconds to produce the thermally-oxidized film with a thickness of 100 Å, and a sample C was processed with the Ar sputter etching for 80 seconds to produce the thermally-oxidized film with a thickness of 200 Å.

In the case of the sample A, to which the Ar sputter etching was not performed, the resistance increased as the time lapsed after the film formation and changed 3% or more when the sample was left standing over 300 hours.

In the cases of the samples B and C, the resistance change rates were considerably decreased and were suppressed within a range of ±1% relative to the sheet resistance at the time of the film formation even when the sample was left standing over 300 hours.

Further, it was understood from a comparison between the samples B and C that the difference of the Ar sputter etching amounts did not change the above-mentioned advantageous effects, that is, only a small amount of the Ar sputter etching can produce a good result, as shown in FIG. 9.

The thin-CrSi-film resistor element that produces the advantageous effects described above with reference to FIGS. 5-9 is not limited to the thin-CrSi-film resistor element prepared with the formation target Si/Cr of 50/50 wt % or with the formation target Si/Cr of 80/20 wt %. Effects similar to those described above were observed with the thin CrSi film and the thin CrSiN film prepared with the formation target Si/Cr composition in a range of from 50/50 wt % to 90/10 wt %.

Also, the Ar sputter etching method is not limited to the DC bias sputter etching used in this case.

Figure 10:
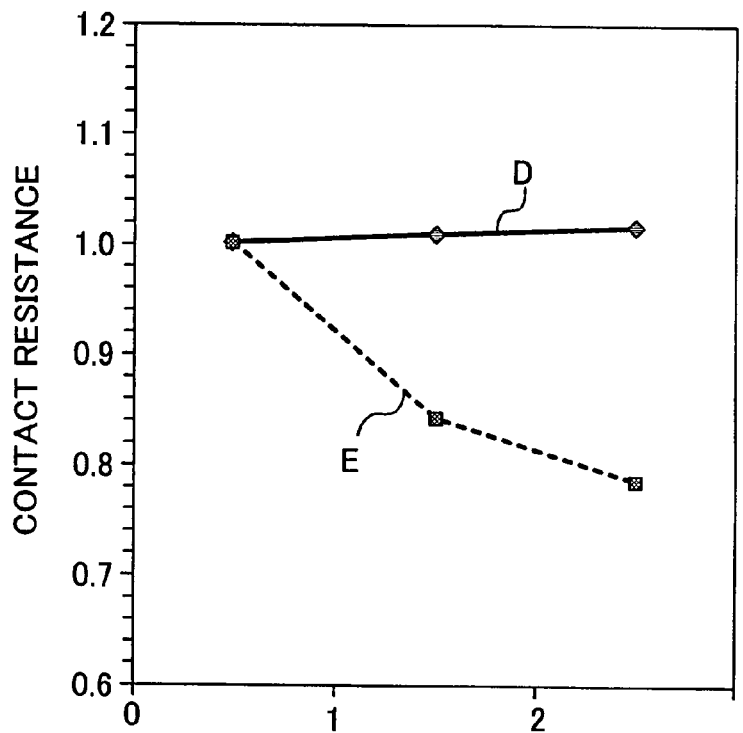
FIG. 10 is a graph for explaining a relationship between variations of contact resistance between the thin-metal-film resistor and the metal wiring and heat treatments performed in cases when a part of a high-melting-point metal film is left deposited on the bottom of the connection holes during a process of forming the connection holes and when the high-melting-point metal film is completely removed.

FIG. 10 shows variations of contact resistance raised between the thin-metal-film resistor element and the metal wiring in contact to each other due to a thermal treatment in two different samples D and E. In the sample D, the high-melting-point metal film was left remaining at the bottom of the connection holes when the connection holes were formed and, in the sample E, the high-melting-point metal film was almost completely removed at the bottom of the connection holes when the connection holes were formed. In FIG. 10, the vertical axis represents a value normalized with the value of the contact resistance presented before the thermal treatment was conducted, and the horizontal axis represents a number of the thermal treatment performed.

These two different samples D and E of the thin metal film shown in FIG. 10 were prepared by adjusting a time length of the dry etching process when the connection holes were formed; one sample had the high-melting-point metal film remaining at the bottom of the connection holes to an extent of a thickness of the order of 500 Å and the other had the same completely removed.

A TiN film was used as the high-melting-point metal film.

The thin-CrSi-film resistor element was formed to have a thickness of 50 Å under exemplary conditions: CrSi with a weight percentage of 80/20 wt %, a DC power of 0.7 kW, an Ar flow rate of 85 sccm, a pressure of 8.5 mTorr, and a process time length of 6 seconds.

The Ar sputter etching before the formation of the thin CrSi film was performed under exemplary conditions: a DC bias of 1250 volts, an Ar flow rate of 20 sccm, a pressure of 8.5 mTorr, and a process time length of 160 seconds. The effect by this process is substantially equivalent to an effect of a process for removing by etching a thermally-oxidized film, formed under a wet atmosphere, by its thickness of 400 Å.

A top view dimension of the connection hole was 0.6 μm by 0.6 μm. The contact resistances were measured with a four-terminal measurement.

The above-described samples D and E were tested by an application of a heat treatment for approximately thirty minutes under a temperature of 350° C. in a nitrogen atmosphere to measure a contact resistance and its variations.

As demonstrated in FIG. 10, the sample D, which had the TiN film at the bottom of the connection holes, showed almost no changes in its contact resistance over time, even through twice the heat treatment from a state of untreated by heat. In contrast to it, the sample E, having had TiN completely removed, changed the contact resistance through twice the heat treatment by more than 20% in comparison with a state before the heat treatment. This indicates that the TiN film serves as a barrier film to prevent the variations of contact resistance generated due to an interaction between the thin CrSi film and the metal wiring.

As described above, the presence of the TiN film between the thin-CrSi-film resistor element and the metal wiring can considerably decrease the changes of contact resistance caused by the heat treatments such as a sintering, the CVD, and the like conducted during the production process. Also, the presence of the TiN film can prevent the variations of contact resistance caused by a heat treatment, such as a soldering process or the like, carried out during an assembling process after the production of the semiconductor apparatus. Thereby, the contact resistance, in conformance with a desired value, can be obtained in a stable manner and the changes of the contact resistance before and after the assembling process can be prevented. Such an effect can facilitate the production of the semiconductor apparatus with a high precision with an improvement of yield.

In the above-described process shown in FIGS. 4A-4K for fabricating the semiconductor apparatus illustrated in FIG. 4K, the second step of FIG. 4B continuously forms the wiring metal film 31 and the high-melting-metal film 33 under vacuum. However, making of the wiring metal film 31 and the high-melting-metal film 33 is not limited to this way.

For example, if the wiring metal film 31 is first formed and, after an exposure of the wiring metal film 31 to an atmosphere, the high-melting-metal film 33 is formed, it becomes difficult to provide an electrical continuity between the wiring metal film 31 and the high-melting-metal film 33 due to an adverse effect by a naturally-oxidized film formed on the surface of the wiring metal film 31.

In such a case, an electrical continuity between the wiring pattern 11 and the thin-CrSi-film resistor element 23 can be obtained by completely removing the high-melting-point metal film 9 on the bottom of the connection holes 21 at the time the connection holes 21 are formed in the second interlayer insulating film 19, which is formed on the wiring pattern 11, which is made of the metal material pattern 7 and the high-melting-point metal film 9 and formed through the patterning process based on the wiring metal film 31 and the high-melting-point metal film 33.

Also, the above second step of FIG. 4B forms the high-melting-point metal film 33 with a thickness of 800 Å and to have two functions as a reflection protection film and as a barrier film. However, this is an unlimited example.

The high-melting-point metal film which serves as a reflection protection film is generally formed to an extent of a thickness of 500 Å or smaller. Also, the thickness of the high-melting-point metal film 9 is slightly reduced during the over-etching process (refer to the seventh step of FIG. 4G) in the formation of the connection holes 21 or the Ar sputter etching process (refer to the eighth step of FIG. 4H) in the thin-metal film formation. Therefore, particularly when the high-melting-point metal film 9 is desired to remain as a barrier film on the bottom of the connection holes 21 in the production process of the semiconductor apparatus according to the present invention, the thickness of the high-melting-point metal film 9 is preferably greater than 500 Å to stably acquire the functionality of the barrier.

As described above, however, the conditions of etching for the formation of the connection holes 21 and the conditions of the Ar sputter etching can be optimized so that reduction of the thickness of the high-melting-point metal film 9 can be minimized. Thus, even when the thickness of the high-melting-point metal film 9 is smaller than 500 Å, it is also possible to ensure the high-melting-point metal film 9 to serve as a barrier film.

Also, as described above, the eighth step of FIG. 4H conducts the Ar sputter etching immediately before the formation of the thin CrSi film 37. Since the high-melting-point metal film 9 is made of the TiN film, it will not form a hard naturally-oxidized film as the AlSiCu film does, even when exposed to the atmosphere. Therefore, when the high-melting-point metal film 9 serving as the barrier film remains on the bottom of the connection holes 21, an electrical connection between the thin CrSi film 37 and the wiring pattern 11 can be made without conducting the Ar sputter etching. However, the Ar sputter etching should preferably be performed because, as described above, the resistance of the thin-CrSi-film resistor element 23 can be stabilized by the performance of the Ar sputter etching immediately before the formation of the thin CrSi film.

Further, the above exemplary embodiment exemplarily forms the SOG film 15 and flattens it with the etch back technique so as to form the second interlayer insulating film 19. The present invention, however, is not limited to the second interlayer insulating film 19 for use as the underlying film for the thin-metal-film resistor element. For example, an insulating film flattened with a publicly known technique, such as a chemical mechanical polish (CMP) or a plasma CVD oxidized film, may be used. However, in practical applications, there are many analog resistor elements used in a configuration and, in these analog resistor element, paring characteristics and a relative accuracy as well as a TCR (temperature coefficient of resistance) are of importance. Accordingly, to apply particularly a thin-metal-film resistor element that forms the semiconductor apparatus of the present invention to an analog resistor element, an underlying insulating film for the thin-metal-film resistor element is preferably subjected to the flattening process.

Figure 11:
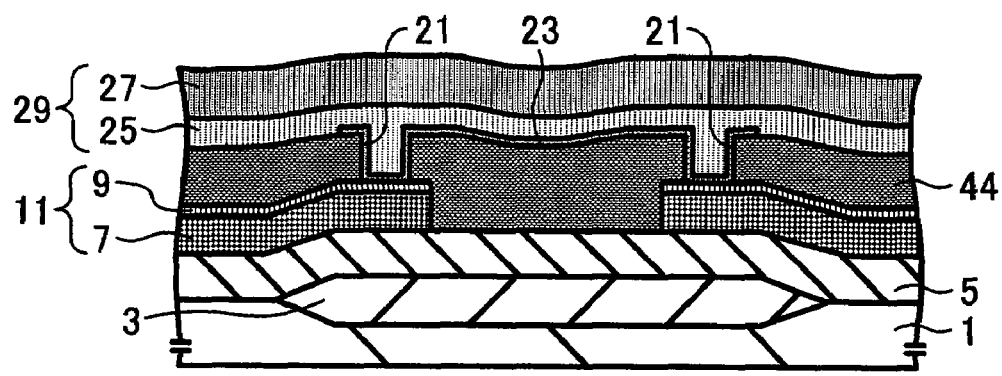
FIG. 11 is a cross-sectional view of a semiconductor apparatus for explaining a semiconductor apparatus and a manufacturing method of manufacturing the same according to another exemplary embodiment of the present invention.

FIG. 11 demonstrates a semiconductor apparatus and a manufacturing method of manufacturing this semiconductor apparatus according to another exemplary embodiment of the present invention. Other than those shown in FIG. 11, various elements are formed on the same substrate but are not shown for the sake of simplicity. These elements not shown include a plurality of transistors, a plurality of capacitors, and so on. In FIG. 11, the elements having the same functions as those shown in FIGS. 4A-4K are assigned with the same reference numerals and accordingly, descriptions for these elements are not repeated. There are formed the element-separation oxide film 3, the first interlayer insulating film 5, and the wiring pattern 11, which includes the metal material pattern 7 and the high-melting-point metal film 9, on the silicon substrate 1.

A second interlayer insulating film 44 including the SOG film is formed on the surfaces of the wiring pattern 11 and the first interlayer insulating film 5. The connection holes 21 are formed in the second interlayer insulating film 44 at regions corresponding to two opposite edges of the thin-metal-film resistor element and the wiring pattern 11.

The formation of the thin-CrSi-film resistor element 23 is extended on a part of the surface of the second interlayer insulating film 44 between regions around the connection holes 21 and surfaces of inner walls of the connection holes 21. The passivation film 29 that includes the silicon oxidized film 25 and the silicon nitride film 27 is formed on the surfaces of the thin-CrSi-film resistor element 23 and the second interlayer insulating film 44.

To make the second interlayer insulating film 44, the SOG is formed to an extent of a thickness of approximately 1000 Å and is then subjected to a heat treatment. With this process, the second interlayer insulating film of the SOG film can be provided with a smooth surface.

Figure 12:
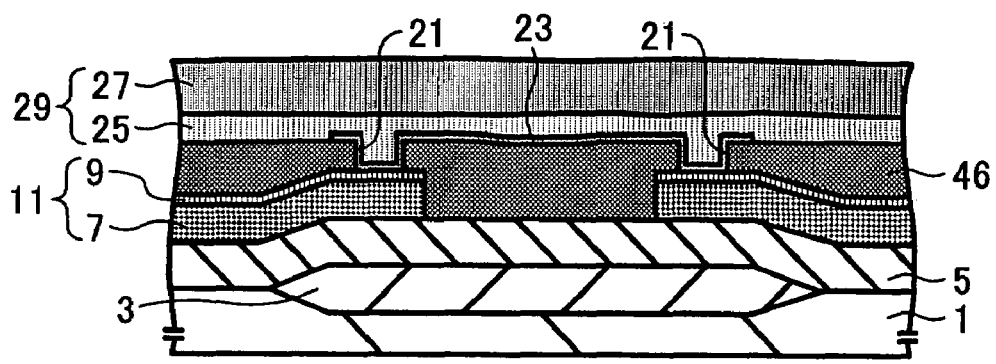
FIG. 12 is a cross-sectional view of a semiconductor apparatus for explaining a semiconductor apparatus and a manufacturing method of manufacturing the same according to another exemplary embodiment of the present invention.

FIG. 12 demonstrates a semiconductor apparatus and a manufacturing method of manufacturing this semiconductor apparatus according to another exemplary embodiment of the present invention. Other than those shown in FIG. 12, various elements are formed on the same substrate but are not shown for the sake of simplicity. These elements not shown include a plurality of transistors, a plurality of capacitors, and so on. In FIG. 12, the elements having the same functions as those shown in FIGS. 4A-4K are assigned with the same reference numerals and accordingly, descriptions for these elements are not repeated.

This embodiment of FIG. 12 has a difference from those shown in FIGS. 4K and 11, which is a smoothened surface of a second interlayer insulating film 46 with the CMP method. The second interlayer insulating film 46 is made of the plasma CVD oxidized film, for example, with which the surface of the second interlayer insulating film 46, disposed underneath the thin-CrSi-film resistor element 23, can be made further smoothened.

To form the second interlayer insulating film 46, the plasma CVD oxidized film is formed to an extent of a thickness of approximately 10000 Å and is then smoothened by being polished approximately down to 4000 Å.

As an alternative, a CVD insulating film formed with a HDP (high-density-plasma) and CVD method can be used as an insulating film disposed underneath the thin-CrSi-film resistor element. For example, a HDP-CVD film formed with a thickness of approximately 8000 Å can have a preferably smoothened surface by being etched back approximately down to 4000 Å.

Also, in the above exemplary embodiment, the passivation film 29 is exemplified to be formed on the thin-CrSi-film resistor element 23. The present invention, however, is not limited to this example. The film to be formed on the thin-CrSi-film resistor element 23 may be of any insulating film. For example, an interlayer insulating film for forming a metal wiring for the second layer can be used for it.

Next, an exemplary process of fabricating a semiconductor apparatus according to another exemplary embodiment of the present invention is explained with reference to FIGS. 13A-13D. FIG. 13D illustrates a final state of an exemplary semiconductor apparatus made through this process. In addition to the elements illustrated in FIGS. 13A-13D, there are various other elements which are formed on the same substrate but not shown in these drawings for the sake of simplicity. These other elements include transistors, capacitors, and so on. In FIGS. 13A-13D, the elements having the same functions as those shown in FIGS. 4A-4K are assigned with the same reference numerals, and descriptions for these elements are not repeated.

In the semiconductor apparatus according to the embodiment of the present invention, as shown in FIG. 13D, the silicon substrate 1 is provided thereon with various layered elements including the element-separation oxide film 3, the first interlayer insulating film 5, the wiring pattern 11, and the second interlayer insulating film 19. The wiring pattern 11 includes the metal material pattern 7 and the high-melting-point metal film 9, and the second interlayer insulating film 19 includes the plasma CVD oxide film 13, the SOG film 15, and the plasma CVD oxide film 17. The second interlayer insulating film 19 is provided with the connection holes 21 at regions corresponding to the two opposite edges of the thin-metal-film resistor element and the wiring pattern 11.

The thin-CrSi-film resistor element 23 is formed on the second interlayer insulating film 19 across the two connection holes 21, the surfaces of the inner walls of the two connection holes 21, and a part of the wiring pattern 11 at regions corresponding to the bottoms of the two connection holes 21. The layer formed on the surface of the thin-CrSi-film resistor element 23 is a CrSiN film 41, and no CrSiO film is formed between the thin-CrSi-film resistor element 23 and the CrSiN film 41.

On the surface of the second interlayer insulating film 19 including the formation region of the thin-CrSi-film resistor element 23, another interlayer insulating film or a passivation film is formed, although it is not shown.

Figure 13A:
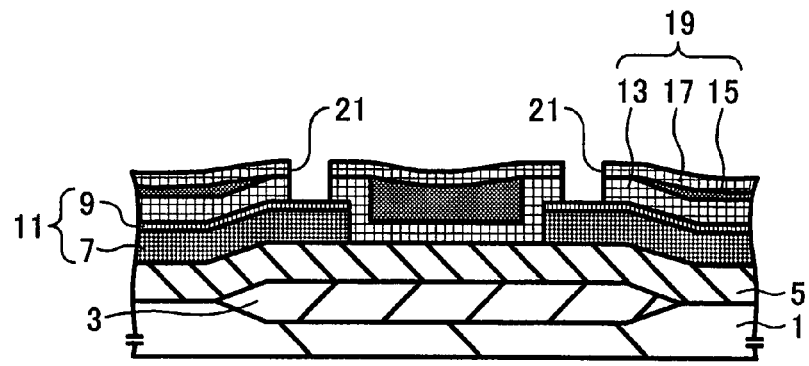
FIGS. 13A-13D are cross-sectional views of a semiconductor apparatus in respective sequential steps of a production process of the semiconductor apparatus according to another exemplary embodiment of the present invention.

FIG. 13A illustrates a step which is performed in a manner similar to the above-described steps of FIGS. 4A-4G. That is, in this step, the first interlayer insulating film 5, the wiring pattern 11 including the metal material pattern 7 and the high-melting-point metal film 9, and the second interlayer insulating film 19 including the plasma CVD oxide film 13, the SOG film 15, and the plasma CVD oxide film 17 are sequentially formed on the silicon substrate 1 on which the formation of the element-separation oxide film 3 has been completed. Subsequently, the connection holes 21 are formed in the second interlayer insulating film 19.

Figure 13B:
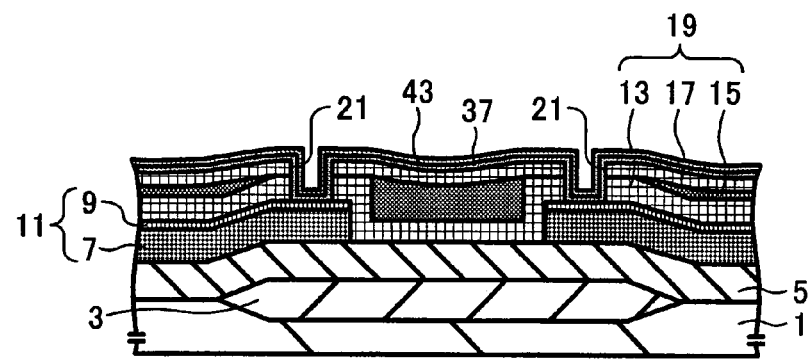

In the step of FIG. 13B, the Ar sputtering etching is performed relative to surfaces of the second interlayer insulating film 19 including the inside walls of the connection holes 21 under vacuum, for example, in the Ar sputtering etching chamber of the multi-chamber sputtering apparatus. With keeping the vacuum after the completion of the Ar sputtering etching, the thin CrSi film 37 for preparing the thin-metal-film resistor element is formed. These operations are performed in a manner similar to the above-described step of FIG. 4H.

Then, in addition to the step of FIG. 4H, with further keeping the vacuum after the formation of the thin CrSi film 37, a CrSiN film 43 is formed on the thin CrSi film 37. In this embodiment, the same target CrSi used for the formation of the thin CrSi film 37 is used under exemplary conditions that a DC (direct current) power is 0.7 kilowatts, a flow rate of Ar plus $N_2$ is 85 sccm, a pressure is 8.5 mTorr, and a process time is 6 seconds. The target CrSi includes 80 wt % (weight percent) of Si and 20 wt % of Cr. As a result, the CrSiN film 43, with a thickness of approximately 50 Å, is formed on the thin-CrSi film 37.

Figure 13C:
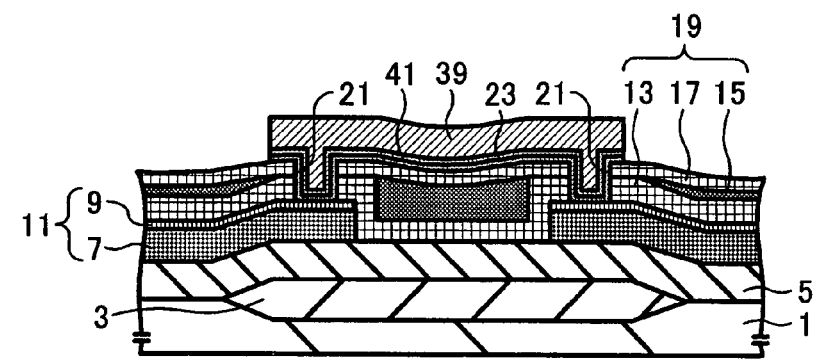
Figure 13D:
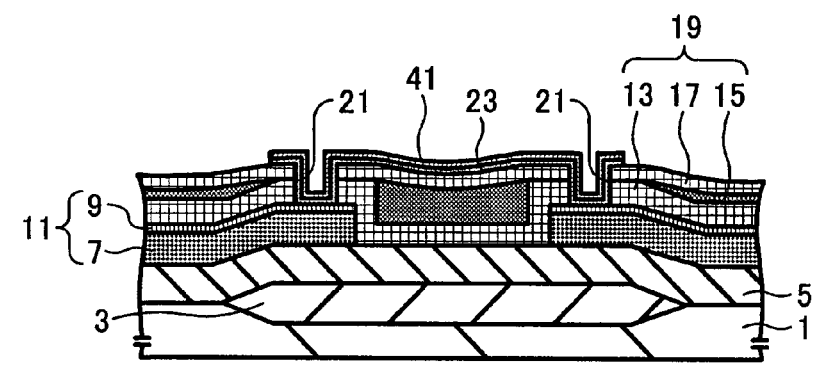

The step of FIG. 13C is performed in a manner similar to the above-described step of FIG. 4I. That is, in this step, the resist pattern 39 is formed for determining the formation region of the thin-metal-film resistor element on the CrSiN film 43 by using the photo engraving technique. Then, the CrSiN film 43 and the thin CrSi film 37 are patterned with a mask of the resist pattern 39 to form a multi-layered pattern including the CrSiN film 41 and the thin-CrSi-film resistor element 23 by using the RIE (reactive ion etching) apparatus.

In the step of FIG. 13D, the resist pattern formed in the step of FIG. 13C is removed. Since the thin-CrSi-film resistor element 23 is electrically connected to the wiring pattern 11 in the connection holes 21, the present embodiment does not need to use the hydrofluoric acid aqueous solution to remove a metal-oxidized film which may be deposited on the surface of the thin-CrSi-film resistor element 23. In addition, the upper surface of the thin-CrSi-film resistor element 23 is covered by the CrSiN film 41 and therefore, it will not be oxidized even when exposed in the atmosphere including oxygen.

Then, on the surface of the second interlayer insulating film 19 including the formation regions of the thin-CrSi-film resistor element 23 and the CrSiN film 41, another interlayer insulating film or a passivation film is formed, although it is not shown.

In general, a thin metal film has a relatively high reactivity to oxygen and changes its resistance value when exposed in the atmosphere for a relatively long time period, which nature is publicly known.

This exemplary embodiment prevents an exposure of the surface of the thin-CrSi-film resistor element 23 in the atmosphere in order to avoid oxidation of the thin-CrSi-film resistor element 23 by forming the CrSiN film 41 on the surface of the thin-CrSi-film resistor element 23. In this operation, the electrical connection between the thin CrSi film 37 and the wiring pattern 11 has been completed at the time the thin CrSi film 37 for preparing the thin-CrSi-film resistor element 23 is formed. Therefore, if a film is formed on the thin CrSi film 37, no substantial characteristic change is caused on the electrical connection.

Figure 14:
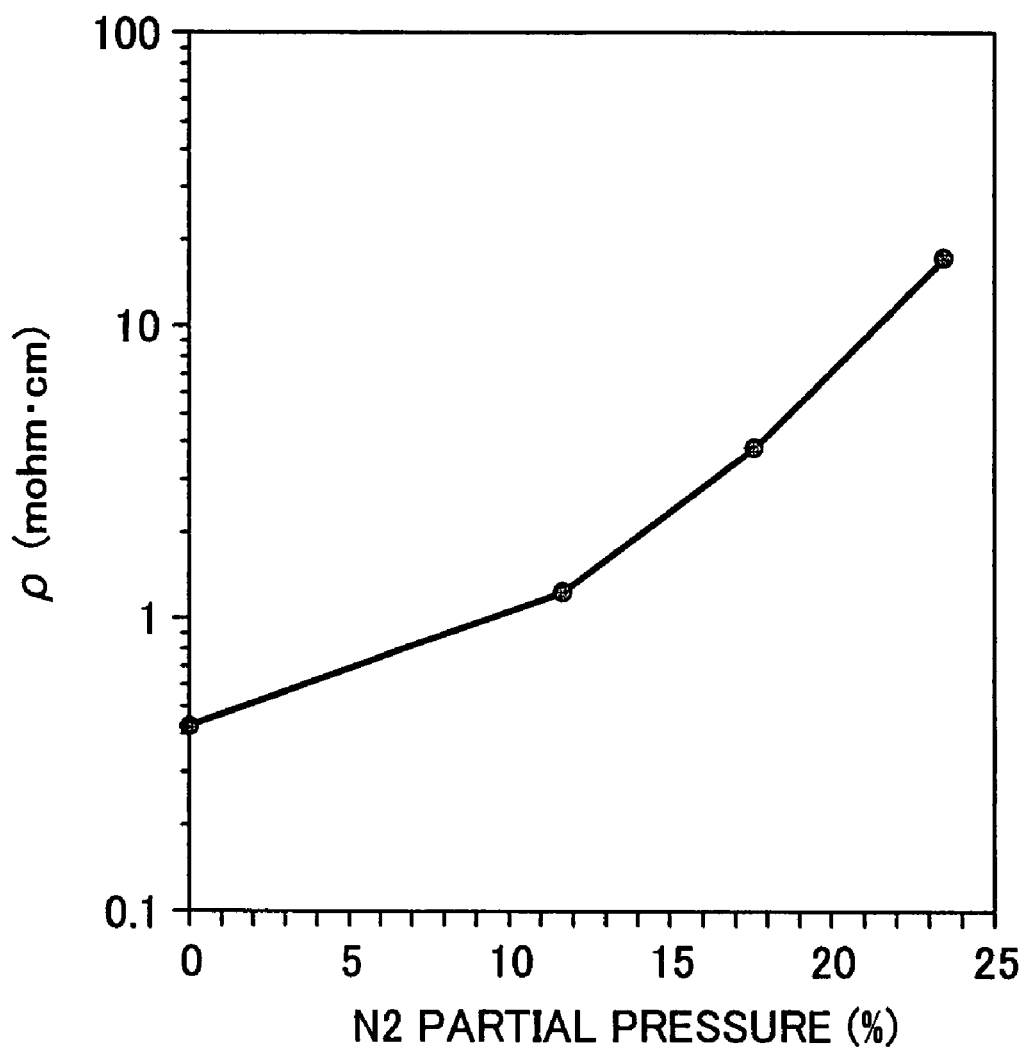
FIG. 14 is a graph for explaining a relationship between a $N_2$ partial pressure of a gas for forming a CrSiN film and a resistivity of the CrSiN film.

FIG. 14 demonstrates a relationship between a $N_2$ partial pressure of a gas for preparing the CrSiN film and a resistance ratio of the CrSiN film. In FIG. 14, the vertical axis represents an electrical resistivity (Q) in units of mohm·cm (milliohm centimeter) and the horizontal axis represents the $N_2$ partial pressure in units of % (percentage). In this embodiment, the CrSi film is formed by adjusting the $N_2$ partial pressure of a gas of Ar and $N_2$ under exemplary conditions: the target CrSi of 50 to 50 in wt %, a DC power of 0.7 kW, a flow rate of 85 sccm for Ar plus $N_2$, a pressure of 8.5 mTorr, and a treatment time of 6 seconds.

The CrSiN film prepared with an addition of the $N_2$ partial pressure by more than 18% with a reactive sputter process has the electrical resistivity more than ten times higher than the one prepared with no addition of the $N_2$ partial pressure. Therefore, when the CrSiN film is formed with an addition of the $N_2$ partial pressure by more than 18%, the total resistance value of the thin-CrSi-film resistor element is determined by the thin CrSi film even if the CrSiN film is formed directly on the thin-CrSi-film resistor element. Accordingly, the CrSiN film will not give the thin CrSi film any substantial change to the resistance value thereof. The $N_2$ partial pressure may have an upper limit of the order of 90%. If the $N_2$ partial pressure is set to a value greater than 90%, a speed of the sputtering is considerably reduced, resulting in an undesirable reduction of production efficiency.

It is possible to use the CrSiN film itself as a thin metal film resistor element when the CrSiN film is formed through the reactive sputter with an addition of a partial pressure of $N_2$ in a range of 6% to 11%, for example.

The above-described embodiment forms the CrSiN film 41 on the thin-CrSi-film resistor element 23. It is possible to form an alternative insulating film for the CVD such as a silicon nitride film on the thin-CrSi-film resistor element 23. However, a CVD chamber is not usually available in a general multi-chamber sputter apparatus. Therefore, to form any insulating film for the CVD continuously in a vacuum on the thin-CrSi-film resistor element 23, an additional cost may be needed to purchase a multi-chamber sputter apparatus having a CVD chamber, resulting in an increase of the production cost.

The present embodiment, as described above, forms the CrSiN film 43 on the thin CrSi film 37 for preparing the thin-CrSi-film resistor element 23 and can prepare the CrSiN film 43 for serving as an anti-oxidation cover for the thin-CrSi-film resistor element 23 without breaking the vacuum by using the existing multi-chamber sputter apparatus. Thus, with this configuration according to the present invention, it is not needed to purchase a new sputter apparatus.

As described above, the present embodiment uses the TiN film, as one example, as the high-melting-point metal films 9 and 33 and can use other alternative films, such as TiW or WSi films, as the high-melting-point metal films 9 and 33.

Also, in the above-described embodiment, the present invention is applied to a semiconductor apparatus having the wiring pattern 11, which is a single-layered wiring pattern, but the present invention is not limited to such semiconductor apparatus. It is possible to apply the present invention to a semiconductor apparatus having a multi-layered metal wiring structure. In this case, the metal wiring disposed underneath the thin-metal-film resistor element for making an electrical connection of the thin-metal-film resistor element can be any one of the multiple layers.

When the present invention is applied to a semiconductor apparatus having a multi-layered metal-wiring structure, the wiring pattern electrically connected to the thin-metal-film resistor element can be formed as an uppermost wiring pattern so that, for example, a layout of the thin-metal-film resistor element can be readily changed by changing a layout of the thin-metal-film resistor element and the uppermost wiring pattern. As such, a degree of flexibility in design can be increased. Also, by arranging the thin-metal-film resistor element on the insulating film formed on the uppermost wiring pattern, a final protection film made of an insulating material is formed on an upper layer disposed above the thin-metal-film resistor element. In comparison with a case where a film other than the final protection film is formed on an upper layer disposed above the thin-metal-film resistor element, a thickness of the insulating film disposed above the thin-metal-film resistor element can be made thinner so that the variations of such thickness can be decreased. Accordingly, during the trimming process to radiate a laser to the thin-metal-film resistor element, variations of the laser interference at the insulating film above the thin-metal-film resistor element can be made smaller so that variations of laser energy given to the thin-metal-film resistor element can be decreased. Thereby, the accuracy of the trimming process can be increased. Further, the above-described structure can improve a heat discharging capability relative to a temperature rise with respect to the thin-metal-film resistor element due to the laser exposure during the trimming process.

Further, the above-described present embodiment uses the metal material pattern 7 with the high-melting-point metal film 9 formed thereon as the wiring pattern 11, which is an unlimited example. For example, a metal material pattern on which no high-melting-point metal film is formed can also be used as an alternative. In this case, when an Al alloy, for example, is used as the metal material pattern, a hard naturally-oxidized film is formed on the surface of the metal material pattern. Therefore, it is preferable to conduct a removal process for removing the naturally-oxidized film formed on the surface of the metal material pattern on the bottom of the connection holes before the thin metal film for preparing the thin-metal-film resistor element is formed after the connection holes are formed. This removal process can be combined with the Ar sputter etching treatment that aims to control the change of the resistance value of the thin-metal-film resistor element over time. Also, the wiring pattern is not limited to the one made of an Al alloy and can be a wiring pattern made of another metal material such as a Cu wiring pattern formed by a damascene method.

Further, the above-described present embodiment uses a pattern made of the metal material pattern 7 and the high-melting-point metal film 9 as the wiring pattern 11 for making a potential for the thin-CrSi-film resistor element 23, as one example. The present embodiment can alternatively use a polysilicon film pattern in place of the metal material pattern 7.

Next, an exemplary process of fabricating a semiconductor apparatus according to another exemplary embodiment of the present invention is explained with reference to FIGS. 15A-15D. FIG. 15D illustrates a final state of an exemplary semiconductor apparatus made through this process. In addition to the elements illustrated in FIGS. 15A-15D, there are various other elements that are formed on the same substrate but not shown in these drawings for the sake of simplicity. These other elements include transistors, capacitors, and so on. In FIGS. 15A-15D, the elements having the same functions as those shown in FIGS. 4A-4K are assigned with the same reference numerals, and descriptions for these elements are not repeated.

In the semiconductor apparatus according to the embodiment of the present invention, as shown in FIG. 15D, the element-separation oxide film 3 is formed on the silicon substrate 1. On an oxide film (not shown) and the element-separation oxide film 3 formed on the silicon substrate 1, a polysilicon pattern 45 and a wiring pattern 49 including a high-melting-point metal film 47 formed on the polysilicon pattern 45 are formed. The high-melting-point metal film is made of, for example, WSi or TiSi.

The first interlayer insulating film 5 is formed on the surface of the silicon substrate 1 including the formation region of the wiring pattern 49 and the element-separation oxide film 3. The connection holes 21 are formed in the first interlayer insulating film 5 at regions corresponding to two opposite edges of the thin-metal-film resistor element and to the wiring pattern 49.

The thin-CrSi-film resistor element 23 is formed on the first interlayer insulating film 5 across the two connection holes 21, the surfaces of the inner walls of the two connection holes 21, and a part of the wiring pattern 49 at regions corresponding to the bottoms of the two connection holes 21.

On the surface of the first interlayer insulating film 5 including the formation region of the thin-CrSi-film resistor element 23, another interlayer insulating film or a passivation film is formed, although it is not shown.

Figure 15A:
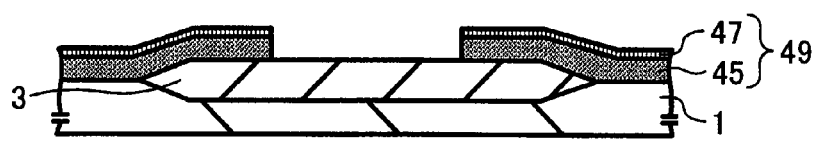
FIGS. 15A-15D are cross-sectional views of a semiconductor apparatus in respective sequential steps of a production process of the semiconductor apparatus according to another exemplary embodiment of the present invention.

In the step of FIG. 15A, the element-separation oxide film 3 is formed on the silicon substrate 1 and other oxide films (not shown), such as a gate oxide film for a transistor, are formed on the silicon substrate 1 at regions in which the element-separation oxide film 3 is not formed. After the formation of these oxide films, a polysilicon film is formed on the entire surface of the silicon substrate 1. Then, a polysilicon pattern 45, having a lowered resistance, is formed at the same time a gate electrode of the transistor is formed, for example. The high-melting-point metal film is formed on the entire surface of the silicon substrate 1 including the formation region of the polysilicon pattern 45. Then, the polysilicon pattern 45 is changed into a salicide and the high-melting-point metal film 47, such as TiSi or WSi, is formed on the polysilicon pattern 45 so as to form the wiring pattern 49.

Figure 15B:
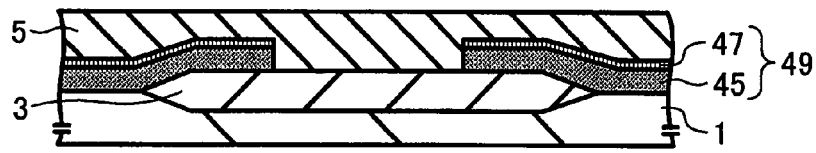

FIG. 15B demonstrates a step performed in a manner similar to the above-described step of FIG. 4A. That is, in this step, the first interlayer insulating film 5 is formed on the entire surface of the silicon substrate 1 including the surface of the wiring pattern 49.

Figure 15C:
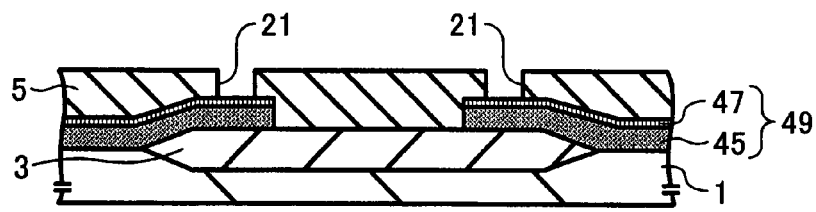
Figure 15D:
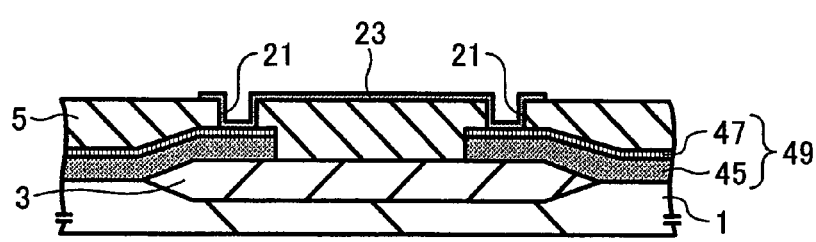

In the step of FIG. 15C, a resist pattern (not shown) is formed with a known photo engraving technique to make connection holes in the first interlayer insulating film 5 at regions corresponding to two opposite edges of the thin-metal-film resistor element and the wiring pattern 49. Then, by using that resist pattern as a mask, the first interlayer insulating film 5 is selectively removed so as to form the connection holes 21 in the first interlayer insulating film 5. The high-melting-point metal film 47 partly remains on the bottom of the connection holes 21. The resist pattern is then removed.

FIG. 15D demonstrates a step performed in a manner similar to the above-described steps of FIGS. 4H and 4I. In this step, the Ar sputtering etching is performed relative to surfaces of the second interlayer insulating film 19 including the inside walls of the connection holes 21 under vacuum in an Ar sputtering etching chamber of the multi-chamber sputtering apparatus. Subsequently, without breaking the vacuum after completion of the Ar sputtering etching, a thin-CrSi film for making the thin-metal-film resistor element is formed. Then, the thin metal film is patterned so as to form the thin-CrSi-film resistor element 23.

After that, on the surface of the first interlayer insulating film 5 including the formation region of the thin-CrSi-film resistor element 23, another interlayer insulating film, a metal wiring, and a passivation film are formed, although they are not shown.

According to the above embodiment shown in FIGS. 15A-15D, there is no need to conduct the patterning process with the wet etching after the patterning process of the thin-CrSi-film resistor element 23.

Also, because a surface of the thin-CrSi-film resistor element 23 in contact with the wiring pattern 49 is not exposed to the atmosphere, the electrical connection between the thin-CrSi-film resistor element 23 and the wiring pattern 49 can be made stably and sufficiently without performing the processes for eliminating surface oxidized film and forming an etching protection barrier film.

Thereby, the thin-CrSi-film resistor element 23 can be miniaturized to a sufficient extent while stabilizing its resistance value without increasing the number of processes, regardless of the thickness of the thin-CrSi-film resistor element 23.

Further, since the high-melting-point metal film 47, functioning as a barrier film, is formed between the thin-CrSi-film resistor element 23 and the polysilicon pattern 45, variations of the contact resistance between the thin-CrSi-film resistor element 23 and the polysilicon pattern 45 can be reduced, thereby increasing the yield and the accuracy of the resistance value.

Further, since the high-melting-point metal film 47 contributes to reduce the resistance of the polysilicon pattern 45 at the same time, the high-melting-point metal film 47 can be formed without increasing the manufacturing process in comparison with the conventional technique. Thereby, the contact resistance between the thin-metal-film resistor element and the wiring pattern can be stabilized while an increase of the manufacturing cost is suppressed.

Further, since this embodiment of FIGS. 15A-15D conducts the Ar sputter etching treatment before the formation of the thin metal film for preparing the thin-CrSi-film resistor element 23, the variations of the sheet resistance generated due to the above-mentioned reasons such as the length of the lapse time from the previous process and the material difference can greatly be improved.

As an alternative, the embodiment of FIGS. 15A-15D can form the CrSiN film on the thin-CrSi-film resistor element 23, as the embodiment of FIGS. 13A-13D conducts.

Although the embodiments explained above uses CrSi as an exemplary material for the thin-metal-film resistor element. As an alternative, any other materials can be used such as NiCr, TaN, $CrSi_2$, CrSiN, CrSi, CrSi, CrSiO, etc.

A thin-metal-film resistor element forming a semiconductor apparatus according to the embodiment of the present invention and a thin-metal-film resistor element formed with a production method according to the embodiment of the present invention can be employed by a semiconductor apparatus that includes an analog circuit. An exemplary semiconductor apparatus is explained below, which has an analog circuit that includes a thin-metal-film resistor element according to the embodiment of the present invention.

Figure 16:
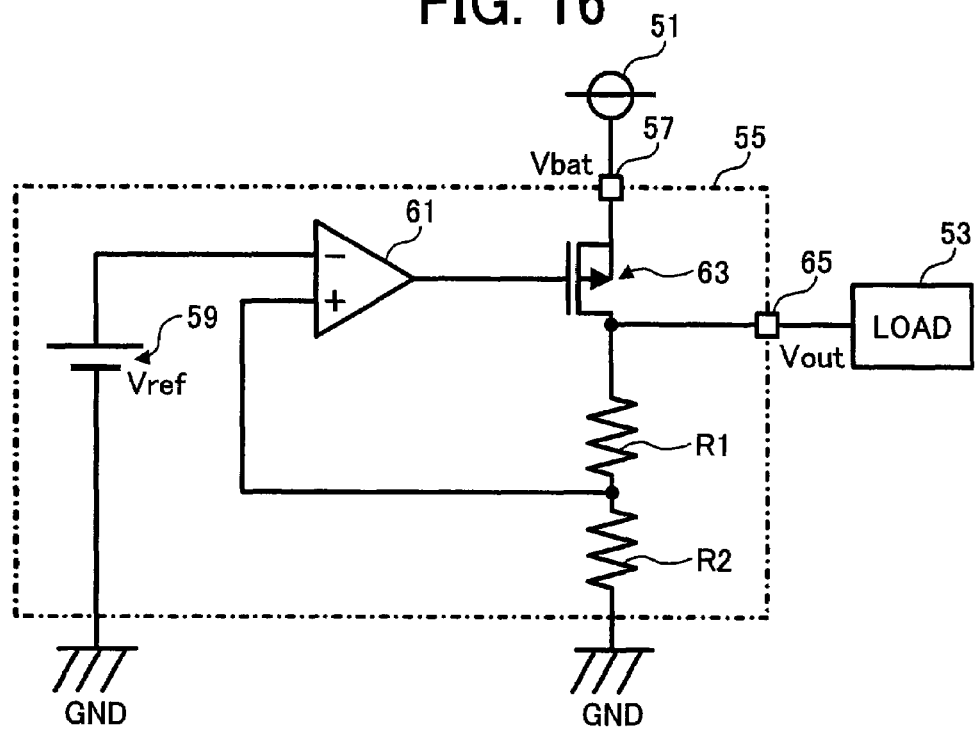
FIG. 16 is a circuit diagram of a semiconductor apparatus, having an analog constant voltage generator, according to the embodiment of the present invention.

FIG. 16 illustrates an exemplary semiconductor apparatus that includes a constant voltage generator made of analog circuitry. As shown in FIG. 16, the semiconductor apparatus is provided with a constant voltage generator 55 for stably supplying power from a direct current power source 51 to a load 53. The constant voltage generator 55 includes an input terminal 57, a reference voltage generator 59, an operational amplifier 61, a P-channel MOS (metal oxide semiconductor) transistor (PMOS) 63, resistors R1 and R2, and an output terminal 65. A source voltage Vbat from the direct current power source 51 appears at the input terminal 57. The reference voltage generator 59 has a negative terminal connected to a common ground (GND). The resistors R1 and R2 are serially connected. The resistor R1 has one end connected to a drain of the PMOS and the resistor R2 has one end connected to the common ground (GND).

The operational amplifier 61 has an output terminal connected to a gate electrode of the PMOS 63, an inverse input terminal indicated by a sign of "−" and a non-inverse input terminal indicated by a sign of "+". The inverse input terminal receives a reference voltage Vref from the reference voltage generator 59. The non-inverse input terminal receives a divided voltage generated by a combination of the resistors R1 and R2, which divide an output voltage Vout appearing at the output terminal 65 at a ratio of resistance values of the resistors R1 and R2. The operational amplifier 61 controls the output voltage from its output terminal such that the divided voltage is substantially equal to the reference voltage Vref.

Figure 17:
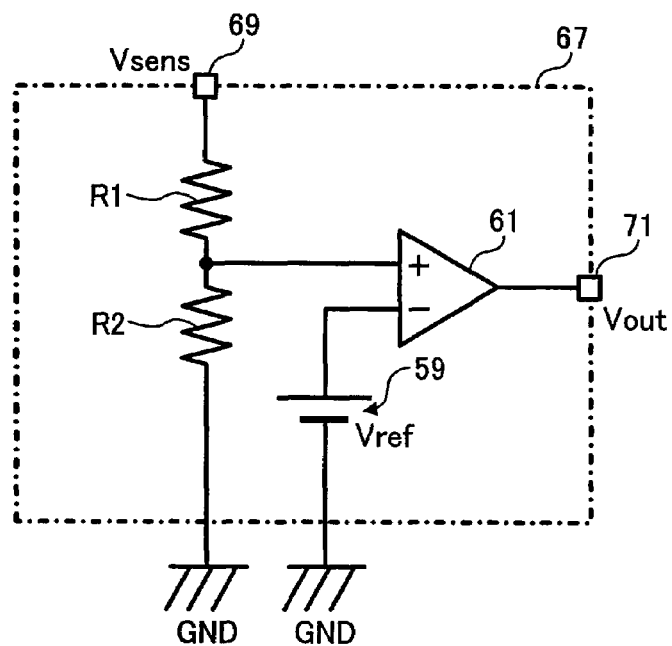
FIG. 17 is a circuit diagram of a semiconductor apparatus, having an analog voltage detector, according to the embodiment of the present invention.

FIG. 17 illustrates an exemplary semiconductor apparatus that includes a voltage detector 67 made of analog circuitry. The voltage detector 67 includes the above-described reference voltage generator 59, the operational amplifier 61, and the resistors R1 and R2. The voltage detector 67 further includes an input terminal 69 and an output terminal 71. An input voltage Vsens to be detected is input to the input terminal 69, and an output voltage from the operational amplifier 61 is output to the output terminal 71.

The reference voltage generator 59 applies the reference voltage Vref to the inverse input terminal of the operational amplifier 61. The input voltage Vsens to be detected is applied via the input terminal 69 to the resistors R1 and R2 so as to be divided by the resistors R1 and R2. A divided voltage from the resistors R1 and R2 is input to a non-inverse input terminal of the operational amplifier 61. The operational amplifier 61 outputs the output voltage outside through the output terminal 71.

In the voltage detector 67, when the voltage Vsens to be detected is high and the divided voltage divided by the resistors R1 and R2 is higher than the reference voltage Vref, the operational amplifier 61 maintains the output at a high level. When the voltage Vsens to be detected is lowered and the divided voltage divided by the resistors R1 and R2 becomes lower than the reference voltage Vref, the operational amplifier 61 produces the output at a low level.

Generally, in the constant voltage generator of FIG. 16 and the voltage detecting circuit of FIG. 17, the reference voltage Vref generated from the reference voltage generator is fluctuated due to various factors of variations in a manufacturing process. In order to accommodate these variations in the process, a voltage dividing circuit is used as a voltage dividing resistor element, such as the resistors R1 and R2. The voltage dividing circuit can easily adjust its resistor value by cutting a fuse element included therein.

Figure 18:
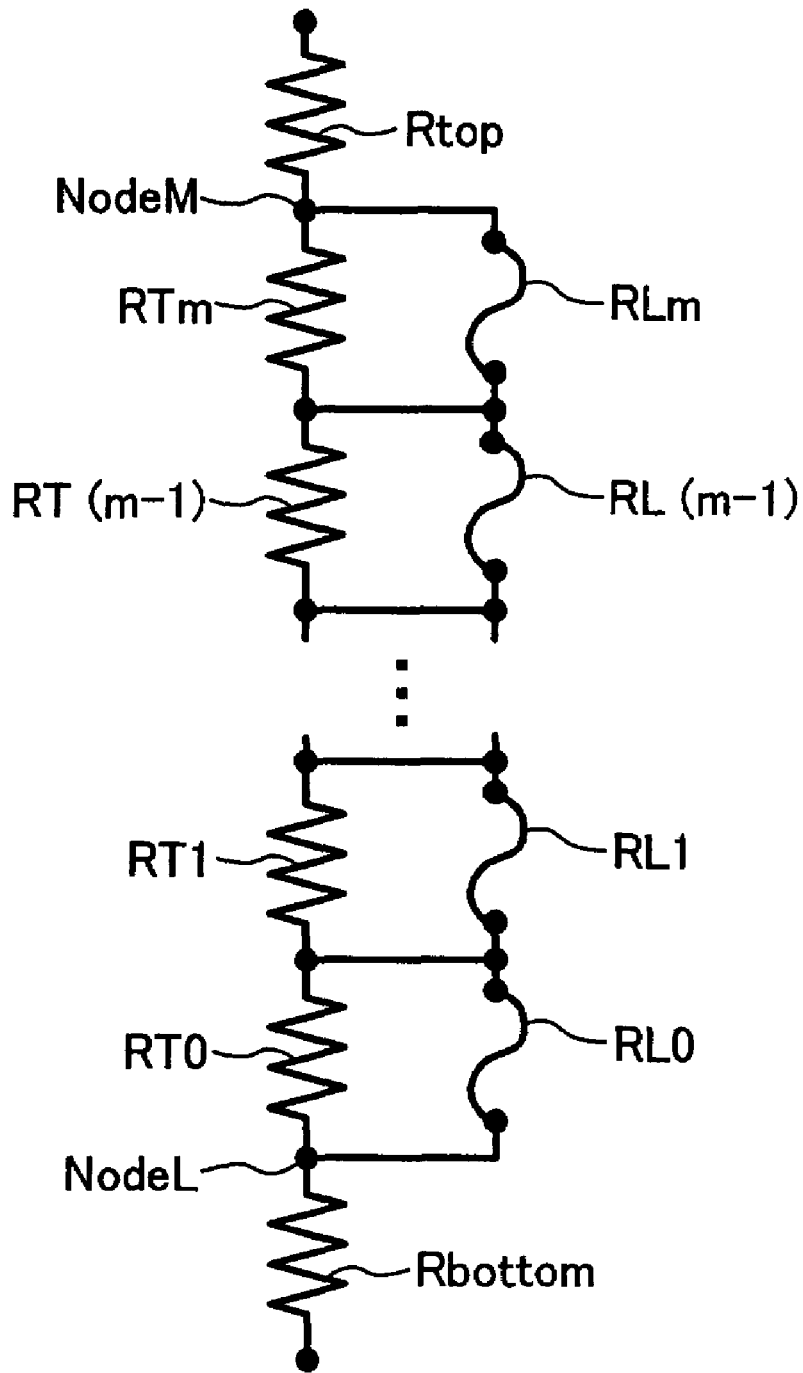
FIG. 18 is a circuit diagram of an exemplary voltage dividing circuit including a thin-metal-film resistor element according to the present invention.
Figure 19:
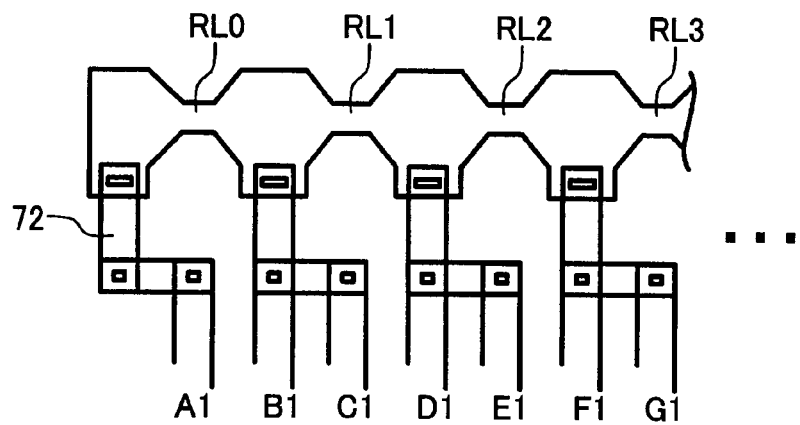
FIG. 19 illustrates a fuse element part of the voltage dividing circuit of FIG. 18.
Figure 20:
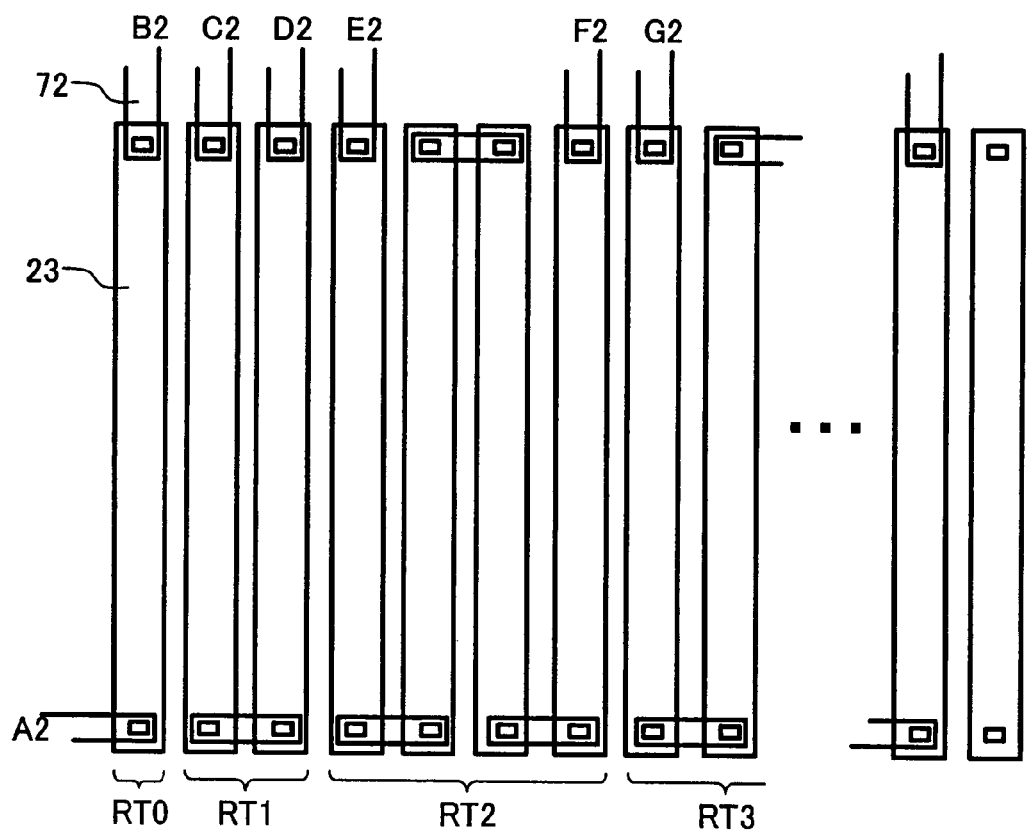
FIG. 20 illustrates a resistor element part of the voltage dividing circuit of FIG. 18.

FIG. 18 illustrates an exemplary voltage dividing circuit to which the thin-metal-film resistor element according to the present invention is applied. FIG. 19 illustrates a circuitry layout of a fuse element part of the voltage dividing circuit. FIG. 20 illustrates a circuitry layout of a thin-metal-film resistor element part of the voltage dividing circuit.

As shown in FIG. 18, the layout includes a fuse element Rbottom, m+1 resistor elements including RT0, RT1, . . . , RTm, in which m is a positive integer, and a resistance element Rtop are connected in series. The resistor elements RT0, RT1, . . . , RTm are connected in parallel to fuse elements RL0, RL1, . . . , RLm, respectively.

As shown in FIG. 19, each of the fuse elements RL0, RL1, . . . , RLm includes, for example, a polysilicon pattern having a resistance in a range of 20Ω to 40Ω, for example.

Values of the resistor elements RT0, RT1, . . . , RTm are set to increase sequentially from the Rbottom to the Rtop, each by a factor of 2. That is, the value of the resistor element RTn is equal to $2^n$ of a unit value, where the unit value is a resistance value of the resistor element RT0.

For example, as shown in FIG. 20, when one piece of the thin-CrSi-film resistor element 23 is used as the resistor element RT0, which is regarded as a unit resistor, the resistor element RTn is made of $2^n$ pieces of the thin-CrSi-film resistor element 23.

In FIGS. 19 and 20, the metal wiring patterns 72 electrically connect a portion A1 of FIG. 19 to a portion A2 of FIG. 20, a portion B1 of FIG. 19 to a portion B2 of FIG. 20, a portion C1 of FIG. 19 to a portion C2 of FIG. 20, a portion D1 of FIG. 19 to a portion D2 of FIG. 20, a portion E1 of FIG. 19 to a portion E2 of FIG. 20, a portion F1 of FIG. 19 to a portion F2 of FIG. 20, and a portion G1 of FIG. 19 to a portion G2 of FIG. 20.

Thus, in a voltage dividing circuit, emphasis has been placed upon accuracy in ratio of a pair of resistors. The voltage dividing circuit is designed in a form of a ladder such that a unit resistor having a pair of resistor element and fuse element is connected in series. This is due to increasing fabrication accuracy in a manufacturing process.

In such a voltage dividing circuit, the fuse elements RL0, RL1, . . . , RLm are cut by a laser beam to provide a desired serial resistance.

Since the thin-metal-film resistor element forming the semiconductor apparatus of the present invention can achieve miniaturization and provide a stable resistance, the voltage dividing circuit of FIG. 18 can be miniaturized and increase an accuracy of the output voltage.

When the voltage dividing circuit of FIG. 18 is applied to the resistors R1 and R2 of the constant voltage generator 55 of FIG. 16, the resistor element Rbottom is connected to the common ground GND and the resistor element Rtop is connected to the drain of the PMOS 63, for example. Further, a terminal NodeL between the resistor elements Rbottom and RT0, or a terminal NodeM between the resistor elements Rtop and RTm is connected to the non-inverse input terminal of the operational amplifier 61.

Since accuracy of the resistors R1 and R2 used in the voltage dividing circuit can be improved by using a voltage dividing circuit employing the thin-metal-film resistor element according to the present invention, the constant voltage generator 55 can improve the stability of the output voltage. Further, with the miniaturized size of the voltage dividing circuit, the constant voltage generator 55 can be made in a relatively small size.

When the voltage dividing circuit of FIG. 18 is applied to the resistors R1 and R2 of the voltage detector 67 in FIG. 17, the resistor element Rbottom is connected to the common ground GND and the resistor element Rtop is connected to the input terminal 69, for example. Further, the terminal NodeL between the resistor elements Rbottom and RT0, or the terminal NodeM between the resistor elements Rtop and RTm is connected to the non-inverse input terminal of the operational amplifier 61.

Since accuracy of the resistors R1 and R2 used in the voltage dividing circuit can be improved by using a voltage dividing circuit employing the thin-metal-film resistor element according to the present invention, the voltage detector 67 can improve the stability of the output voltage. Further, with the miniaturized size of the voltage dividing circuit, the voltage generator 67 can be made in a relatively small size.

Figure 21:
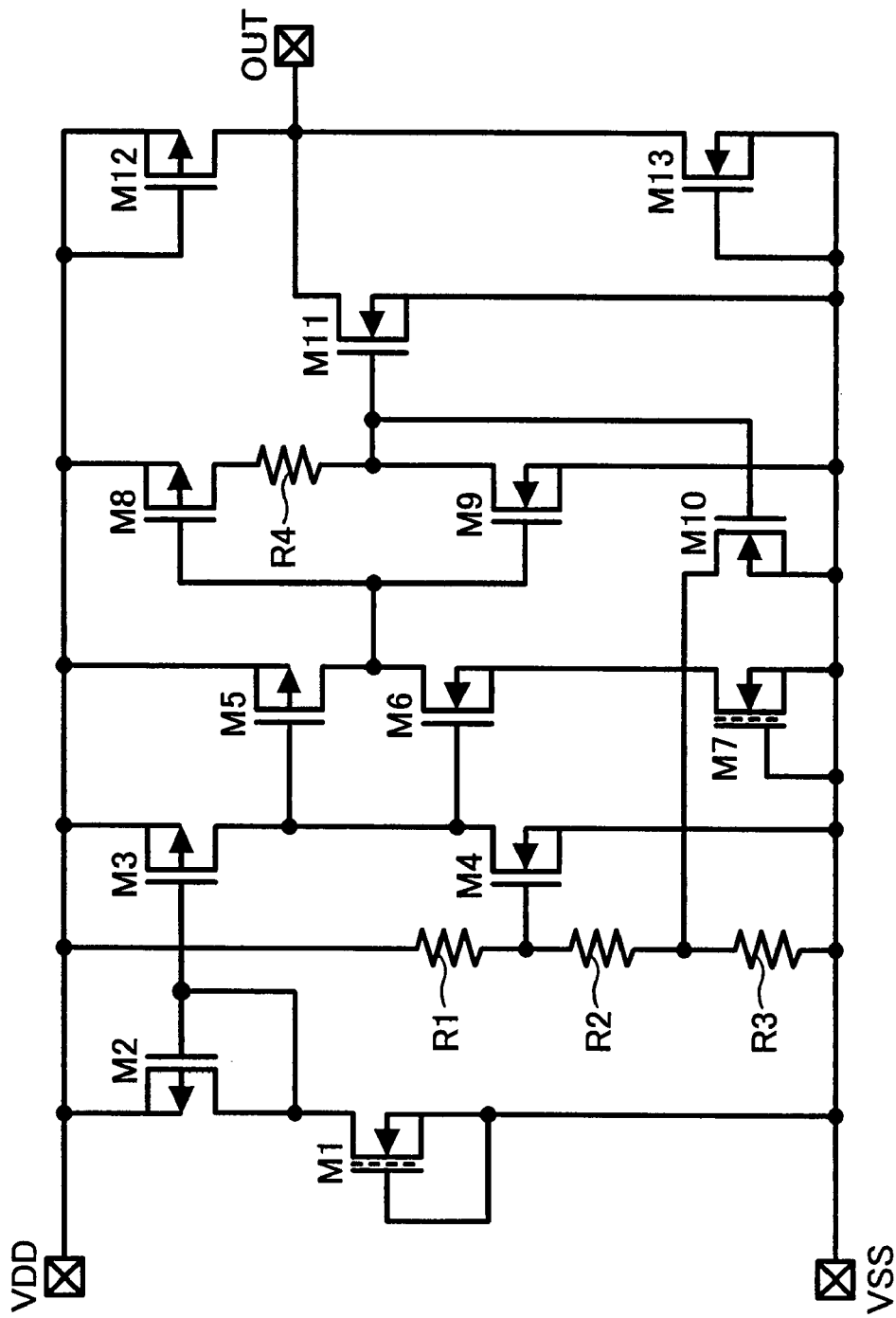
FIG. 21 is a circuit diagram of a semiconductor apparatus, having a voltage detector as an analog circuit, according to another embodiment of the present invention.
Figure 22:
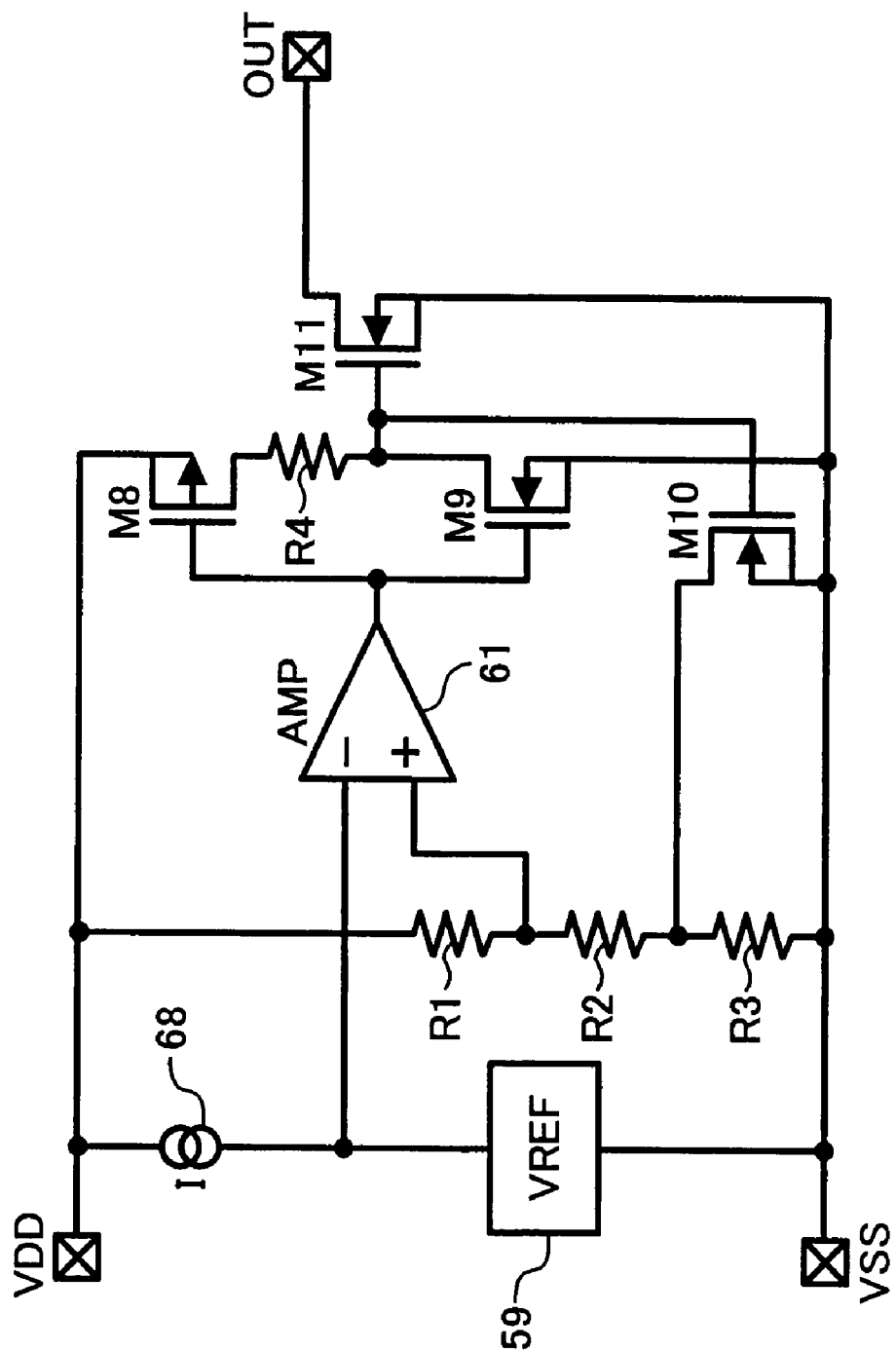
FIG. 22 is a block diagram of the circuit diagram of FIG. 21.

Referring to FIGS. 21 and 22, a semiconductor apparatus having a voltage detector of an analog circuit according to another exemplary embodiment of the present invention is explained. FIG. 21 is a circuit diagram of the semiconductor apparatus and FIG. 22 is a block diagram thereof. In FIG. 22, a current source 68 includes a depletion-switching transistor M1 and PMOS transistors M2 and M3 of FIG. 21. A current of the depletion-switching transistor M1 at a bias 0 is used as a reference current, and the direction of the current is reversed with a current mirror circuit made of the PMOS transistors M2 and M3.

In FIG. 22, an operational amplifier 61 includes an NMOS transistor M4, a PMOS transistor M5, an NMOS transistor M6, and a depletion-switching transistor M7. The PMOS transistor M5 and the NMOS transistor M6 form an inverting amplifier, and the depletion transistor M7 determines a bias current of the inverting amplifier. In addition, the gate of the NMOS transistor M4 is used as a non-inverting input terminal indicated by a plus symbol and the gate of the PMOS transistor. PMOS transistor M5 is used as an inverting input terminal indicated by a minus symbol.

A PMOS transistor M8 and an NMOS transistor M9 form an inverter to invert an output of the operational amplifier 61 and also to serve as an output buffer.

A resistor element R4 connected between the transistors M8 and M9 produces a relatively small delay to adjust time of the operation when the output from the inverter of the transistors M8 and M9 changes from a low level to a high level.

An NMOS transistor M10 is turned on when the inverter of the transistors M8 and M9 produces its output at a high level so that a resistor element R3 is made as a short circuit and, as a result, a voltage detected is given a hysteresis.

An NMOS transistor M11 is a transistor for inverting the output from the inverter of the transistors M8 and M9 and for outputting it to an output terminal OUT. An NMOS transistor M12 and a PMOS transistor M13 shown in FIG. 21 are protection circuits for the output terminal OUT.

The resistor element R3 and resistor elements R1 and R2 are used for a detection of a VDD voltage. The resistor elements R1 and R2 form a voltage dividing resistor element. A voltage at an intersection point of the resistor elements R1 and R2 is compared with a threshold voltage Vgs of the NMOS transistor M4. The resistor element R3 is, as described above, to generate a hysteresis.

As the resistor elements R1 and R2, the resistor element of FIGS. 18-20 can be used.

Also, the thin-metal-film resistor element of the semiconductor apparatus according to the present invention can be applied to a part or whole of the resistor elements R1, R2, R3, and R4.

An exemplary operation of the voltage detector is below explained. When the voltage VDD at a terminal to be measured is higher than a detected voltage, the voltage at the intersection point of the resistor elements R1 and R2 is higher than the threshold voltage of the NMOS transistor M4 of the operational amplifier 61 and the NMOS transistor M4 is turned on. Consequently, the gate voltage for the transistors M5 and M6 is reduced so that the PMOS transistor M5 is turned on and the NMOS transistor M6 is turned off. As a result, the operational amplifier 61 produces an output at a high level.

This output level from the operational amplifier 61 is inverted to a low level by the inverter of the transistors M8 and M9 and is then input to the gate of the NMOS transistor M11 so that the NMOS transistor M11 is turned off.

On the other hand, when the voltage VDD at a terminal to be measured is lower than a detected voltage, the voltage at the intersection point of the resistor elements R1 and R2 is lower than the threshold voltage of the NMOS transistor M4 of the operational amplifier 61 and the NMOS transistor M4 is turned off. Consequently, the gate voltage for the transistors M5 and M6 is increased so that the PMOS transistor M5 is turned off and the NMOS transistor M6 is turned on. As a result, the operational amplifier 61 produces an output at a low level.

This output level from the operational amplifier 61 is inverted to a high level by the inverter of the transistors M8 and M9 and is then input to the gate of the NMOS transistor M11 so that the NMOS transistor M11 is turned on.

Figure 23:
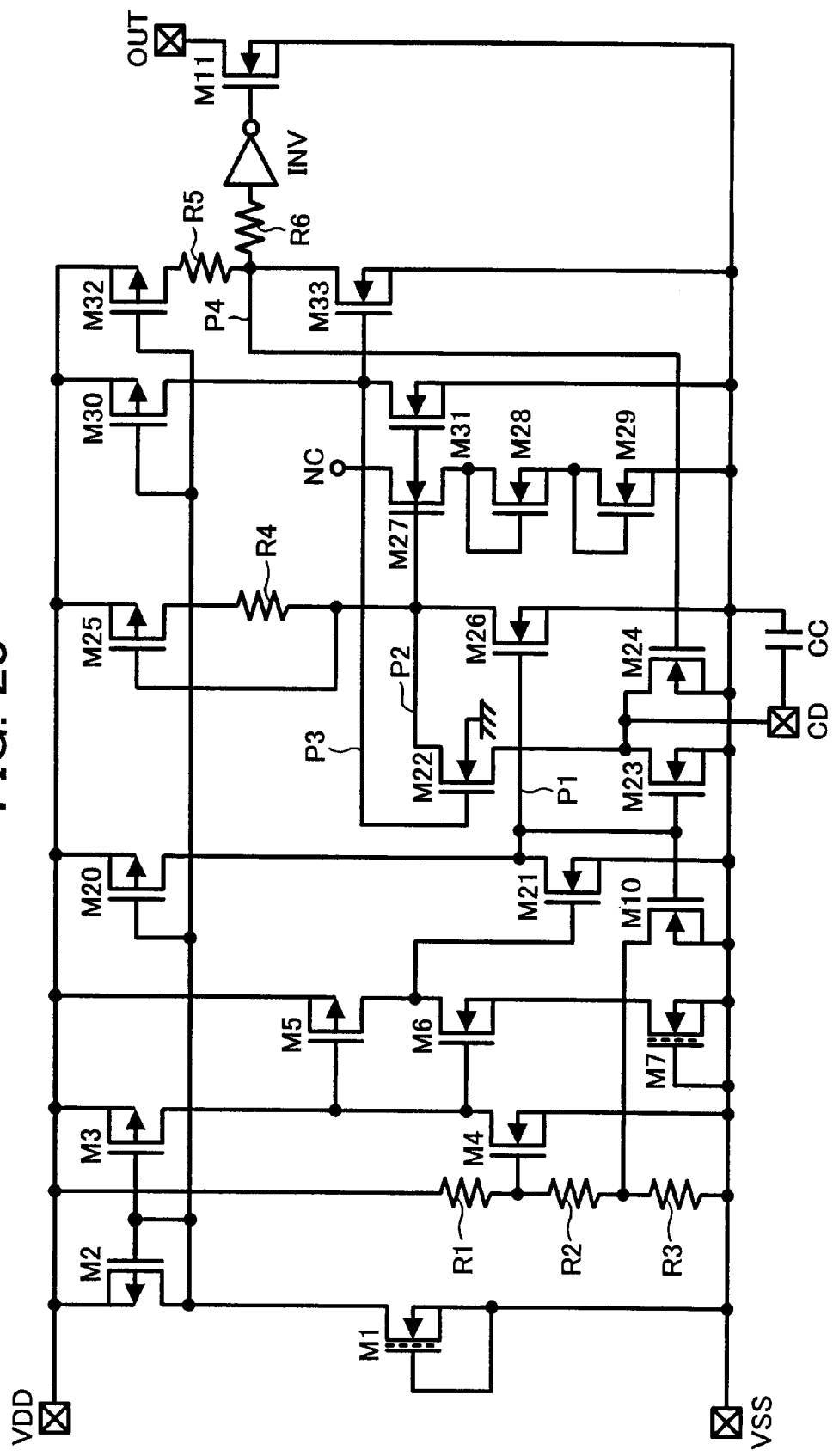
FIG. 23 is a circuit diagram of a semiconductor apparatus, having a voltage detector as an analog circuit, according to another embodiment of the present invention.
Figure 24:
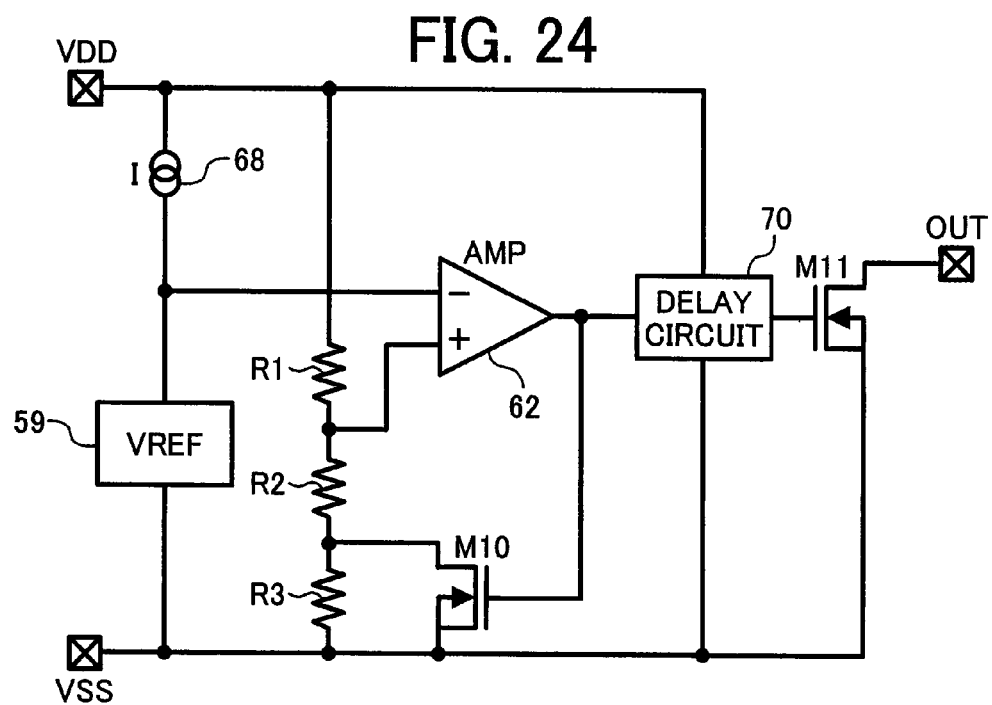
FIG. 24 is a block diagram of the circuit diagram of FIG. 21.
Figure 25:
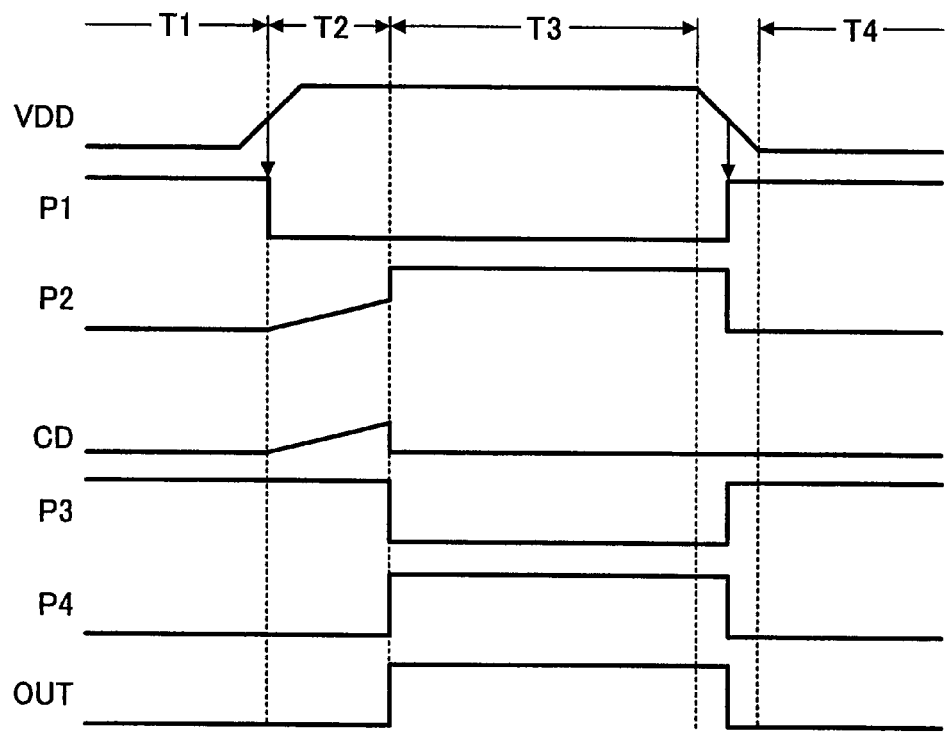
FIG. 25 is a time chart for explaining a delay circuit included in the semiconductor apparatus of FIG. 23

Referring to FIGS. 23-25, a semiconductor apparatus having a voltage detector of an analog circuit according to another exemplary embodiment of the present invention is explained. FIG. 23 is a circuit diagram of the semiconductor apparatus, and FIG. 24 is a block diagram thereof, and FIG. 25 is a time chart for explaining a delay circuit of the voltage detector. The delay circuit of this embodiment is the one explained above with reference to FIG. 21. In FIGS. 23-25, elements having the same functions as those shown in FIGS. 21 and 22 are assigned with the same reference numerals and therefore descriptions for these elements are not repeated.

As with the case of FIG. 21, this embodiment of FIG. 23 includes the current source 68 of the depletion-switching transistor M1 and PMOS transistors M2 and M3, the reference voltage (Vref) 59, the resistor elements R1, R2, and R3, and the NMOS transistors M10 and M11. The reference voltage (Vref) 59 is obtained based on the threshold voltage generated when the current from the current source 68 is applied to the drain of the NMOS transistor M4. An operational amplifier 62 includes the NMOS transistor M4, the PMOS transistor M5, NMOS transistor M6, the depletion transistor M7, and an inverter including a PMOS transistor M20 as a constant current load and an NMOS transistor M21. The operational amplifier 62 has an output terminal connected to a delay circuit 70. The delay circuit 70 includes MOS transistors M22-M33 and a resistor element R5. The MOS transistors M27-M29, however, are used in place of the MOS transistor M31 in case the IC detects a relatively high voltage.

A capacitor CC externally connected between a terminal CD and a terminal VSS is charged through the PMOS transistor M25 and the resistor element R5. The capacitor CC is supplied with a charging current when the NMOS transistor M22 is on and the NMOS transistor M26 is off but is not supplied when the NMOS transistor M22 is off and the NMOS transistor M26 is on.

The capacitor CC discharges when one of the NMOS transistors M23 and M24 is turned on. The charge voltage of the capacitor CC is detected at the gate of the NMOS transistor M31 when the NMOS transistor M22 is on.

The output of the delay circuit 70 is led to an output circuit with a two-stage inverter circuit including a resistor element R6, an inverter INV, and the NMOS transistor M11.

As the resistor elements R1 and R2, the resistor element of FIGS. 18-20 can be used.

Also, the thin-metal-film resistor element of the semiconductor apparatus according to the present invention can be applied to a part or whole of the resistor elements R1, R2, R3, R4, R5 and R6.

With reference to FIG. 25, an exemplary operation of the delay circuit 70 is explained. When the voltage VDD at a terminal to be measured is lower than a detected voltage during a time period P1, the output voltage of the operational amplifier 61 is high (at a point P1 in FIG. 23) which causes the NMOS transistor M23 to turn on and the drain voltage of the NMOS transistor M23 is low. Thereby, the voltage of the capacitor CC is 0 volts. At this time, the drain of the NMOS transistor M26 has a low voltage (at a point P2 in FIG. 23) and is yet connected to the gate of the NMOS transistor M31 so that the NMOS transistor M31 is off and the drain of the NMOS transistor M31 has a high voltage (at a point P3 in FIG. 23). The drain of the NMOS transistor M31 is connected to the gate of the NMOS transistor M33 so that the NMOS transistor M33 is turned on and its drain has a low voltage (at a point P4 in FIG. 23). The drain of the NMOS transistor M33 is connected to the gate of the NMOS transistor M24 so that the NMOS transistor M24 is turned off. Also, the drain voltage of the NMOS transistor M33 is inverted by the inverter INV through the resistor element R6 and then changes the gate voltage of the NMOS transistor M11 to a high level so that the NMOS transistor M11 forming an output transistor is turned on.

When the voltage VDD at the terminal to be measured is changed from a voltage lower than the detected voltage to a voltage higher than the detected voltage during time periods T2 and T3, the output of the operational amplifier 62 at the point P1 is changed from a high level to a low level and consequently the NMOS transistor changes its state from the on-state to the off-state. The NMOS transistor M24 is off, as described above, and the gate voltage of the NMOS transistor M22 at the point P3 is high. As a consequence, the NMOS transistor M22 is on, which causes the gate of the NMOS transistor M26, connected to the output terminal of the operational amplifier 62, to change to a low level so that the NMOS transistor M26 is turned off. As a result, the capacitor CC is supplied with the charge current through the PMOS transistor M25, the resistor element R5, and the NMOS transistor M22. The delay time can be changed by changing a resistance value of the resistor element R5.

When the voltage of the capacitor CC is increased during the time period T2, the drain voltage of the NMOS transistor M22 at the point P2 increases as well. When the drain voltage of the NMOS transistor M22 at the point P2 exceeds the threshold voltage of the NMOS transistor M31, the NMOS transistor M31 is turned on. Upon such event, the drain voltage of the NMOS transistor M31 at the point P3 is low. Since the drain voltage of the NMOS transistor M31 is equal to the gate voltage of the NMOS transistor M22, the NMOS transistor M22 is off and the charging to the capacitor CC is stopped.

The drain of the NMOS transistor M31 is also connected to the gate of the NMOS transistor M33 and consequently the NMOS transistor M33 is off. As a result, the drain voltage of the NMOS transistor M33 at the point P4 is high. The drain of the NMOS transistor M33 is connected to the gate of the NMOS transistor M24 and consequently the NMOS transistor M24 is on. Therefore, the charge of the capacitor CC is discharged and is decreased to 0 volts.

The drain voltage of the NMOS transistor M33 is inverted by the inverter INV through the resistor element R6 so that the gate of the NMOS transistor M11 is turned to a low level. Thereby, the NMOS transistor M11, which is an output transistor, is turned off.

As described above, a charging time period in which the capacitor CC is charged from 0 volts to a voltage approximately equal to the threshold voltage of the NMOS transistor M31 is a delay time. This delay time is substantially determined by factors of a capacitance of the capacitor CC and a resistance value of the resistor element R5.

When the voltage VDD at the terminal to be measured is changed from a voltage higher than the detected voltage to a voltage lower than the detected voltage during a time period T4, the output of the operational amplifier 62 at the point P1 is changed from a low level to a high level. The NMOS transistor M23 is changed from an off-state to an on-state and consequently the voltage of the capacitor CC remains as 0 volts. The gate of the NMOS transistor M26 connected to the output terminal of the operational amplifier 62 is changed to a high level and consequently the NMOS transistor M26 is turned on. This makes the drain voltage of the NMOS transistor M26 low at the point P2 and the NMOS transistor M31 is turned off.

When the NMOS transistor M31 is turned off, the drain voltage of the NMOS transistor M31 becomes high at the point P3. Accordingly, the NMOS transistor M22 is turned on, but because the NMOS transistor M is on, the charging to the capacitor CC is not executed.

Also, since the NMOS transistor M31 is off, the NMOS transistor M33 is on and the drain voltage of the NMOS transistor M33 is low at the point P4. This causes the NMOS transistor M24 to turn off. The gate of the NMOS transistor M11 is changed to a high level through the resistor element R6 and the inverter INV so that the NMOS transistor M11 is turned on.

As described above, the delay circuit is not operated when the voltage VDD is changed from a voltage higher than the detected voltage to a voltage lower than the detected voltage.

The semiconductor apparatus including the voltage dividing circuit to which the thin-metal-film resistor element according to the present invention is applied is not limited to the semiconductor apparatuses that include the constant voltage generator and the voltage detector. The present invention may be applied to any semiconductor apparatuses that include a voltage dividing circuit.

Moreover, the semiconductor apparatus including the voltage dividing circuit to which the thin-metal-film resistor element according to the present invention is applied is not limited to the semiconductor apparatuses that include a voltage dividing circuit. The present invention may be applied to any semiconductor apparatuses that include the thin-metal-film resistor element. For example, the thin-metal-film resistor element according to the present invention can be used as a resistor element in such a way that the resistor element itself is cut with laser light, for example, or characteristics of the resistor element are changed so that the resistance value of the resistor element is adjusted.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substitutional for each other within the scope of this disclosure and appended claims.

What is claimed is:

1. A method of manufacturing a semiconductor apparatus in which a thin-metal-film resistor element is formed on a first insulating film, the method comprising the steps of:

providing a wiring pattern on the first insulating film at regions corresponding to regions in which two opposite edges of the thin-metal-film resistor element are formed;

forming a second insulating film on the wiring pattern and on the first insulating film;

making connection holes in the second insulating film at regions corresponding to regions in which the two opposite edges of the thin-metal-film resistor element and the wiring pattern are formed;

producing a thin metal film on the second insulating film and on inner walls of the connection holes; and patterning the thin metal film such that a part of the thin metal film remains in the connection holes so as to form a thin-metal-film resistor element.

2. The method according to claim 1, wherein the producing step produces the thin metal film with a thickness in a range of approximately 5Å to approximately 1000Å.

3. The method according to claim 1, wherein the second insulating film is subjected to a planarizing process.

4. The method according to claim 1, wherein the producing step conducts an etching to the second insulating film with an Ar sputter etching before producing the thin metal film.

5. The method according to claim 4, wherein the producing step continuously forms the thin metal film without breaking the vacuum after conducting the etching to the second insulating film with the Ar sputter etching.

6. The method according to claim 4, wherein the etching with the Ar sputter etching is conducted for an amount of a thickness of 25Å or more which is calculated based on an etching effect on a thermally-oxidized film.

7. The method according to claim 1, wherein the providing step forms the wiring pattern including a metal material pattern and a high-melting-point metal film formed at least on an upper surface of the metal material pattern.

8. The method according to claim 1, wherein the providing step forms the wiring pattern including a polysilicon pattern and a high-melting-point metal film formed at least on an upper surface of the polysilicon pattern.

9. The method according to claim 7, wherein the high-melting-point metal film is formed with a thickness in a range of about 500Å to about 3000Å.

10. The method according to claim 1, wherein the producing step forms the thin metal film in an oxygen-free atmosphere and subsequently forms a metal nitride film on the thin metal film, and the patterning step patterns the metal nitride film and the thin metal film so as to form a multi-layered pattern including a metal nitride film pattern and the thin-metal-film resistor element.

11. The method according to claim 10, wherein a nitrogen partial pressure in a sputter gas at a time the metal nitride is formed in a range of about 18% to about 90%.

12. The method according to claim 1, wherein the wiring pattern is an uppermost wiring pattern.

\* \* \* \* \*